US009322543B2

(12) United States Patent
Hussell et al.

(10) Patent No.: US 9,322,543 B2
(45) Date of Patent: Apr. 26, 2016

(54) GAS COOLED LED LAMP WITH HEAT CONDUCTIVE SUBMOUNT

(75) Inventors: Christopher P. Hussell, Cary, NC (US); John Adam Edmond, Durham, NC (US); Gerald H. Negley, Chapel Hill, NC (US); Curt Progl, Raleigh, NC (US); Mark Edmond, Raleigh, NC (US); Praneet Athalye, Morrisville, NC (US)

(73) Assignee: Cree, Inc., Durham, NC (US)

( * ) Notice: Subject to any disclaimer, the term of this patent is extended or adjusted under 35 U.S.C. 154(b) by 711 days.

(21) Appl. No.: 13/467,670

(22) Filed: May 9, 2012

(65) Prior Publication Data

US 2013/0271987 A1 Oct. 17, 2013

Related U.S. Application Data

(63) Continuation-in-part of application No. 13/446,759, filed on Apr. 13, 2012.

(51) Int. Cl.

| | |
|---|---|
| ***F21V 29/00*** | (2015.01) |
| ***H05K 13/00*** | (2006.01) |
| ***F21V 29/65*** | (2015.01) |

(Continued)

(52) U.S. Cl.

CPC ................ *F21V 29/65* (2015.01); *F21K 9/135* (2013.01); *F21V 3/0472* (2013.01); *F21V 29/60* (2015.01); *F21V 29/85* (2015.01); *H01K 1/00* (2013.01); *F21V 29/506* (2015.01); *F21V 29/63* (2015.01); *F21V 29/67* (2015.01); *F21Y 2101/02* (2013.01);

(Continued)

(58) Field of Classification Search

CPC ...... F21Y 2101/02; F21K 9/00; F21V 29/004

See application file for complete search history.

(56) References Cited

U.S. PATENT DOCUMENTS

| | | | | |
|---|---|---|---|---|
| 3,581,162 | A | 5/1971 | Wheatley | |
| 3,936,686 | A * | 2/1976 | Moore | 313/36 |

(Continued)

FOREIGN PATENT DOCUMENTS

| | | | |
|---|---|---|---|
| DE | 29923899 | U1 | 4/1999 |
| DE | 102007034123 | A1 | 1/2009 |

(Continued)

OTHER PUBLICATIONS

U.S. Appl. No. 13/340,928, filed Dec. 30, 2011.

(Continued)

*Primary Examiner* — Joseph L Williams

(74) *Attorney, Agent, or Firm* — Dennis J. Williamson; Moore & Van Allen PLLC

(57) ABSTRACT

A gas cooled LED lamp and submount is disclosed. The centralized nature of the LEDs allows the LEDs to be configured near the central portion of the optical envelope of the lamp. In example embodiments, the LEDs can be cooled and/or cushioned by a gas in thermal communication with the LED array to enable the LEDs to maintain an appropriate operating temperature for efficient operation and long life. In some embodiments, the LED assembly is mounted on a glass stem. In some embodiments a thermal resistant path is created that prevents overtemperature of the LED array during the making of the lamp. In some embodiments the LED assembly comprises a lead frame and/or metal core board that is bent into a three-dimensional shape to create a desired light pattern in the enclosure or an extruded submount formed into a three-dimensional shape.

27 Claims, 26 Drawing Sheets

(51) Int. Cl.

| | |
|---|---|
| ***F21K 99/00*** | (2016.01) |
| ***F21V 3/04*** | (2006.01) |
| ***H01K 1/00*** | (2006.01) |
| ***F21V 29/60*** | (2015.01) |
| ***F21V 29/85*** | (2015.01) |
| *F21Y 101/02* | (2006.01) |
| *F21Y 111/00* | (2016.01) |
| *F21V 29/506* | (2015.01) |
| *F21V 29/63* | (2015.01) |
| *F21V 29/67* | (2015.01) |

(52) U.S. Cl.
CPC ...... *F21Y 2111/001* (2013.01); *F21Y 2111/005* (2013.01); *Y10T 29/49002* (2015.01)

(56) References Cited

U.S. PATENT DOCUMENTS

| | | | | |
|---|---|---|---|---|
| 5,463,280 | A | 10/1995 | Johnson | |
| 5,561,346 | A | 10/1996 | Byrne | |
| 5,585,783 | A | 12/1996 | Hall | |
| 5,655,830 | A | 8/1997 | Ruskouski | |
| 5,688,042 | A | 11/1997 | Madadi et al. | |
| 5,806,965 | A | 9/1998 | Deese | |
| 5,947,588 | A | 9/1999 | Huang | |
| 5,949,347 | A | 9/1999 | Wu | |
| 5,952,916 | A | 9/1999 | Yamabe | |
| 6,161,910 | A | 12/2000 | Reisenauer et al. | |
| 6,220,722 | B1 | 4/2001 | Begemann | |
| 6,227,679 | B1 | 5/2001 | Zhang et al. | |
| 6,234,648 | B1 | 5/2001 | Borner et al. | |
| 6,250,774 | B1 | 6/2001 | Begemann et al. | |
| 6,276,822 | B1 | 8/2001 | Bedrosian et al. | |
| 6,414,801 | B1 | 7/2002 | Roller | |
| 6,452,217 | B1 | 9/2002 | Wojnarowski et al. | |
| 6,465,961 | B1 | 10/2002 | Cao | |
| 6,523,978 | B1 | 2/2003 | Huang | |
| 6,550,953 | B1 | 4/2003 | Ichikawa et al. | |
| 6,634,770 | B2 | 10/2003 | Cao | |
| 6,635,987 | B1 | 10/2003 | Wojnarowski et al. | |
| 6,659,632 | B2 | 12/2003 | Chen | |
| 6,709,132 | B2 | 3/2004 | Ishibashi | |
| 6,746,885 | B2 | 6/2004 | Cao | |
| 6,803,607 | B1 | 10/2004 | Chan et al. | |
| 6,848,819 | B1 | 2/2005 | Arndt et al. | |
| 6,853,151 | B2 * | 2/2005 | Leong et al. | 315/185 R |
| 6,864,513 | B2 | 3/2005 | Lin et al. | |
| 6,948,829 | B2 | 9/2005 | Verdes et al. | |
| 6,982,518 | B2 | 1/2006 | Chou et al. | |
| 7,048,412 | B2 | 5/2006 | Martin et al. | |
| 7,080,924 | B2 | 7/2006 | Tseng et al. | |
| 7,086,756 | B2 | 8/2006 | Maxik | |
| 7,086,767 | B2 | 8/2006 | Sidwell et al. | |
| 7,144,135 | B2 | 12/2006 | Martin et al. | |
| 7,165,866 | B2 | 1/2007 | Li | |
| 7,172,314 | B2 | 2/2007 | Currie et al. | |
| 7,213,940 | B1 | 5/2007 | Van De Ven et al. | |
| 7,354,174 | B1 | 4/2008 | Yan | |
| 7,396,142 | B2 | 7/2008 | Laizure, Jr. et al. | |
| 7,600,882 | B1 | 10/2009 | Morejon et al. | |
| 7,726,836 | B2 | 6/2010 | Chen | |
| 7,824,065 | B2 | 11/2010 | Maxik | |
| 7,965,023 | B1 | 6/2011 | Liang | |
| 8,021,025 | B2 | 9/2011 | Lee | |
| 8,253,316 | B2 | 8/2012 | Sun et al. | |
| 8,272,762 | B2 | 9/2012 | Maxik et al. | |
| 8,274,241 | B2 | 9/2012 | Guest et al. | |
| 8,277,082 | B2 | 10/2012 | Dassanayake et al. | |
| 8,282,249 | B2 | 10/2012 | Liang et al. | |
| 8,282,250 | B1 | 10/2012 | Dassanayake et al. | |
| 8,292,468 | B2 | 10/2012 | Narendran et al. | |
| 8,322,896 | B2 | 12/2012 | Falicoff et al. | |
| 8,371,722 | B2 | 2/2013 | Carroll | |
| 8,400,051 | B2 | 3/2013 | Hakata et al. | |
| 8,415,865 | B2 | 4/2013 | Liang et al. | |
| 8,421,320 | B2 | 4/2013 | Chuang | |
| 8,421,321 | B2 | 4/2013 | Chuang | |
| 8,421,322 | B2 | 4/2013 | Carroll et al. | |
| 8,427,037 | B2 | 4/2013 | Liang et al. | |
| 8,449,154 | B2 | 5/2013 | Uemoto et al. | |
| 8,502,468 | B2 | 8/2013 | Li et al. | |
| 8,556,465 | B2 | 10/2013 | Lee et al. | |
| 8,641,237 | B2 | 2/2014 | Chuang | |
| 8,653,723 | B2 | 2/2014 | Cao et al. | |
| 8,696,168 | B2 | 4/2014 | Li et al. | |
| 8,740,415 | B2 | 6/2014 | Wheelock | |
| 8,750,671 | B1 | 6/2014 | Kelly et al. | |
| 8,752,984 | B2 | 6/2014 | Lenk et al. | |
| 8,760,042 | B2 | 6/2014 | Sakai et al. | |
| 2003/0063476 | A1 | 4/2003 | English et al. | |
| 2003/0214810 | A1 | 11/2003 | Zhang | |
| 2004/0201990 | A1 | 10/2004 | Meyer | |
| 2005/0254264 | A1 | 11/2005 | Sidwell et al. | |
| 2008/0037255 | A1 | 2/2008 | Wang | |
| 2009/0050907 | A1 | 2/2009 | Yuan et al. | |
| 2009/0184618 | A1 | 7/2009 | Hakata et al. | |
| 2010/0264800 | A1 | 10/2010 | Liu et al. | |
| 2011/0204393 | A1 | 8/2011 | Masumoto et al. | |
| 2011/0220920 | A1 | 9/2011 | Collins et al. | |
| 2012/0040585 | A1 | 2/2012 | Huang | |
| 2012/0224374 | A1 | 9/2012 | Aliberti | |
| 2012/0268936 | A1 | 10/2012 | Pickard et al. | |
| 2013/0062641 | A1 | 3/2013 | Lin et al. | |
| 2013/0070461 | A1 | 3/2013 | Pickard | |
| 2013/0088848 | A1 | 4/2013 | Lee et al. | |
| 2013/0170221 | A1 | 7/2013 | Isogai et al. | |
| 2014/0340870 | A1 | 11/2014 | Premysler | |

FOREIGN PATENT DOCUMENTS

| | | | |
|---|---|---|---|
| EP | 0890059 | A1 | 1/1991 |
| EP | 1058221 | A2 | 12/2000 |
| EP | 0890059 | B1 | 6/2004 |
| EP | 1471564 | A2 | 10/2004 |
| EP | 1645794 | A2 | 4/2006 |
| EP | 1853096 | A2 | 11/2007 |
| EP | 2236907 | A2 | 10/2010 |
| EP | 2413029 | A2 | 2/2012 |
| EP | 2416056 | A2 | 2/2012 |
| GB | 2345954 | A | 7/2000 |
| GB | 2366610 | A | 3/2002 |
| JP | H09265807 | A | 10/1997 |
| JP | 11111819 | A | 4/1999 |
| JP | 2000173304 | A | 6/2000 |
| JP | 2000188001 | | 7/2000 |
| JP | 2001118403 | A | 4/2001 |
| JP | 2007059930 | A | 3/2007 |
| JP | 2008288183 | A | 11/2008 |
| JP | 2009117346 | A | 5/2009 |
| JP | 3153766 | U | 9/2009 |
| JP | 2009277586 | A | 11/2009 |
| TW | M286462 | U | 1/2006 |
| TW | M360982 | U | 7/2009 |
| TW | M412319 | U | 9/2011 |
| WO | 0124583 | A1 | 4/2001 |
| WO | 0160119 | A2 | 8/2001 |
| WO | 2011098358 | A1 | 8/2011 |
| WO | 2012011279 | A1 | 1/2012 |
| WO | 2012031533 | A1 | 3/2012 |
| WO | 2013040506 | A1 | 3/2013 |

OTHER PUBLICATIONS

U.S. Appl. No. 13/462,388, filed May 2, 2012.
U.S. Appl. No. 12/775,842, filed May 7, 2010.
U.S. Appl. No. 13/192,755, filed Jul. 28, 2011.
U.S. Appl. No. 13/339,974, filed Dec. 29, 2011.
U.S. Appl. No. 13/235,103, filed Sep. 16, 2011.
U.S. Appl. No. 13/360,145, filed Jan. 27, 2012.
U.S. Appl. No. 13/338,095, filed Dec. 27, 2011.
U.S. Appl. No. 13/338,076, filed Dec. 27, 2011.
U.S. Appl. No. 13/405,891, filed Feb. 27, 2012.
Cree, Inc., International Application No. PCT/US2013/035400, International Search Report and Written Opinion, Sep. 17, 2013.

(56) References Cited

OTHER PUBLICATIONS

Cree, Inc., International Application No. PCT/US2014/036283, Invitation to Pay Additional Fees and, Where Applicable, Protest Fee, Sep. 1, 2014.
Cree, Inc. International Application No. PCT/US2014/045951, International Search Report and Written Opinion, Sep. 15, 2014.
Cree, Inc., International Application No. PCT/US2013/035400 Invitation to Pay Additional Fees, and, Where Applicable, Protest Fee, Jun. 5, 2013.
Cree, Inc., International Application No. PCT/US2013/035403 International Search Report and Written Opinion, May 29, 2013.
Panasonic, Screw Type 4W LED Bulb Equivalent to 20W, http://www.panasonic.co.uk/html/en_GB/Products/Lighitng/LED+Lamps/LDAHV4L27CG/Overview/7848548/index.html.
U.S. Appl. No. 13/662,618, filed Oct. 29, 2012.
U.S. Appl. No. 13/446,759, filed Apr. 13, 2012.
U.S. Appl. No. 13/774,078, filed Feb. 22, 2013.
U.S. Appl. No. 61/738,668, filed Dec. 18, 2012.
U.S. Appl. No. 61/712,585, filed Oct. 11, 2012.
U.S. Appl. No. 61/716,818, filed Oct. 22, 2012.
U.S. Appl. No. 61/670,686, filed Jul. 12, 2012.
U.S. Appl. No. 13/758,565, filed Feb. 4, 2013.
U.S. Appl. No. 13/781,847, filed Mar. 1, 2013.
U.S. Appl. No. 13/774,193, filed Feb. 22, 2013.
U.S. Appl. No. 13/781,844, filed Mar. 1, 2013.
U.S. Appl. No. 13/657,421, filed Oct. 22, 2012.
U.S. Appl. No. 13/341,337, filed Dec. 30, 2011.
Cree, Inc., International Application No. PCT/US2014/052120, International Search Report and Written Opinion, Nov. 11, 2014.
Cree, Inc., European Application No. 13716151.9, Office Action, Nov. 28, 2014.
Cree, Inc., International Application No. PCT/US2014/036283, International Search Report and Written Opinion, Feb. 19, 2015.
Cree, Inc., Taiwanese Application No. 102113095, Official Letter, Nov. 30, 2015.

* cited by examiner

GAS COOLED LED LAMP WITH HEAT CONDUCTIVE SUBMOUNT

This application is a continuation-in-part of prior U.S. patent application Ser. No. 13/446,759, filed on Apr. 13, 2012, now U.S. Publication No. 2013/0271972, which is incorporated herein in its entirety.

BACKGROUND

Light emitting diode (LED) lighting systems are becoming more prevalent as replacements for older lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury. A solid-state lighting system may take the form of a lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and or the LEDs in the lamp.

Since, ideally, an LED lamp designed as a replacement for a traditional incandescent or fluorescent light source needs to be self-contained; a power supply is included in the lamp structure along with the LEDs or LED packages and the optical components. A heatsink is also often needed to cool the LEDs and/or power supply in order to maintain appropriate operating temperature. The power supply and especially the heatsink can often hinder some of the light coming from the LEDs or limit LED placement. Depending on the type of traditional bulb for which the solid-state lamp is intended as a replacement, this limitation can cause the solid-state lamp to emit light in a pattern that is substantially different than the light pattern produced by the traditional light bulb that it is intended to replace.

Traditional incandescent bulbs typically comprise a filament supported on support wires where the support wires are mounted on a glass stem that is fused to the bulb. Wires are run through the stem to provide electric current from the bulb's base to the filament. The stem is fused to the enclosure using heat to melt the glass. In traditional incandescent bulbs fusing the stem to the enclosure does not present a particular problem because the heat generated during the fusing operation does not adversely affect the bulb components. However, such an arrangement has been considered to be unsuitable for LED lamp designs because the heat generated during the manufacturing process is known to have an adverse impact on the LEDs. Heat such as applied during the fusing operation can degrade the performance of the LEDs in use such as by substantially shortening LED life. The heat may also affect the solder connection between the LEDs and the PCB, base or other submount where the LEDs may loosen or become dislodged from the PCB, base or other submount. Thus, traditional manufacturing processes and structures have been considered wholly unsuitable for LED based lighting technologies.

SUMMARY

Embodiments of the present invention provide a solid-state lamp with an LED array as the light source. In some embodiments, the LEDs can be mounted on or fixed to a light transmissive submount. In some embodiments, LEDs can be disposed on both sides of a two-sided submount, or on three or more sides if the submount structure includes enough mounting surfaces. In some embodiments, a driver or power supply for the LEDs may also be mounted on the submount or otherwise included in a lamp. The centralized nature and/or the light transmissive structural support of the LEDs in some embodiments allows the LEDs to be configured near the central portion of the structural envelope of the lamp. In example embodiments, the LEDs are cooled by a gas in thermal communication with the LED array to enable the LEDs to maintain an appropriate operating temperature for efficient operation and long life. Since the LED array can be configured to reside near the center of the lamp, the light pattern from the lamp may not be adversely affected by the presence of a heatsink and/or mounting hardware, or by having to locate the LEDs close to the base of the lamp.

A lamp according to at least some embodiments of the invention includes an optically transmissive enclosure and an LED array disposed in the optically transmissive enclosure to be operable to emit light when energized through an electrical connection. In some embodiments, the LED array includes a plurality of LEDs on an optically transmissive submount further comprising at least two sides. A thermic constituent is in thermal communication with the LED array, the submount or both. The thermic constituent can be a liquid or fluid medium, or a heat dissipating material in the form of a heatsink. However, in some embodiments the thermic constituent is a gas contained in the enclosure to provide thermal coupling to the LED array. A thermic constituent in addition to the gas can also be included. In some embodiments, the gas is at a pressure of from about 0.5 to about 10 atmospheres. In some embodiments, the gas is at a pressure of from about 0.8 to about 1.2 atmospheres. In some embodiments, the gas is at a pressure of about 2 atmospheres or about 3 atmospheres.

In some embodiments, the gas in the enclosure has a thermal conductivity of at least 60 mW/m-K. In some embodiments, the gas in the enclosure has a thermal conductivity of at least 150 mW/m-K. In some embodiments, the gas is or includes helium. In some embodiments, the gas is or includes helium and hydrogen. In some embodiments the electrical connection to the LED array and/or the power supply includes a thermally resistive electrical path in order to allow heat to be used to seal the enclosure of the lamp without damaging the electronics in the lamp.

In some embodiments, phosphor is disposed in the LED lamp to provide wavelength conversion for at least a portion of the light from the LEDs. In some embodiments, an optical envelope is disposed inside the optically transmissive enclosure, at least a portion of the gas to cool the LEDs is disposed within the optical envelope, and the phosphor is disposed in or on the optical envelope. In some embodiments of the lamp, the LED array includes a plurality of LED chips, and the plurality of LED chips further comprises at least a first die which, if illuminated, would emit light having a dominant wavelength from 435 to 490 nm, and a second die which, if illuminated, would emit light having a dominant wavelength from 600 to 640 nm, and wherein the phosphor is associated with at least one die, and wherein the phosphor, when excited, emits light having a dominant wavelength from 540 to 585 nm.

An LED lamp according to example embodiments can be assembled by providing the optically transmissive enclosure and centrally locating the LED array in the enclosure. The LED array is energized to emit light. Phosphor may be included in the system as previously mentioned. The enclosure and/or an internal envelope is filed with gas with a thermal conductivity of at least 60 mW/m-K. In some embodiments, a glass enclosure is provided with an internal silica coating to provide a diffuse scattering layer. In such a case, heat may be applied to seal the optically transmissive enclosure of the lamp. If heat is used, the LED array, power supply, or both may be connected to the lamp by an electrical connection providing thermal resistance as mentioned above. The electrical connection does not need to provide thermal cooling during operation, since other mechanisms, such as the gas, may be in place to cool the LEDs and/or the power supply.

In some embodiments a lamp comprises an optically transmissive enclosure. An LED array is disposed in the optically transmissive enclosure to be operable to emit light when energized through an electrical connection. A gas contained in the enclosure provides thermal coupling to the LED array. A glass stem is fused to the enclosure supporting the LED array.

In some embodiments, the electrical connection may comprise a thermally resistive electrical path that prevents overtemperature of the LED array. The thermally resistive electrical path may extend at least partially through the glass stem. The thermally resistive electrical path may comprise a wire having a dimension such that the dimension prevents overtemperature of the LED array. The thermally resistive electrical path may comprise a wire having a zigzag shape, a helical shape, and/or a torturous shape. The LED array may be supported in an LED assembly comprising an electrically conductive element extending from the LED array to a point remote from the LED array where the thermally resistive electrical path comprises a wire that is connected to the electrically conductive element at the point. A power supply may be provided in the electrical connection disposed in the enclosure. The gas may be at a pressure of from about 0.5 to about 10 atmospheres. The gas may be at a pressure of from about 0.8 to about 1.2 atmospheres. A gas movement device may be provided for moving the gas within the enclosure to increase the heat transfer between the LED array and the gas.

In some embodiments a method of making an LED lamp comprises providing a glass enclosure; mounting an LED array on a glass stem part comprising attaching a wire to the LED array and extending the wire through the stem part; locating the stem part in the enclosure with the LED array located in the enclosure; fusing the stem part to the enclosure using heat; the step of mounting an LED array on a glass stem part comprises creating a thermal resistant path in the wire that prevents overtemperature in the LED array during the step of fusing; and inserting a gas through the glass stem part, the gas having a thermal conductivity of at least 60 mW/m-K, the gas providing thermal coupling to the LED array.

In some embodiments, the LED array may be connected to a power supply. The gas may comprise at least one of helium and hydrogen. The method may comprise positioning at least one of a driver and a power supply for the LED array in the enclosure. The method may comprise sealing the stem part after the step of inserting gas through the stem part. The method may comprise attaching the enclosure to a base. The method may comprise positioning a power supply in the base. The method may comprise positioning a gas movement device in the enclosure to move the gas within the enclosure.

In some embodiments a lamp comprises an optically transmissive enclosure. An LED assembly is disposed in the optically transmissive enclosure to be operable to emit light when energized through an electrical connection. The LED assembly comprises a lead frame comprising at least one anode and at least one cathode and at least one LED mounted on the at least one anode and the at least one cathode and a heat sink structure. The lead frame is bent into a three-dimensional shape to create a desired light pattern in the enclosure.

In some embodiments a gas may be contained in the enclosure to provide thermal coupling to the LED assembly. A glass stem may be fused to the enclosure supporting the LED assembly. A portion of the lead frame may be covered with a reflective material to reflect light inside of the enclosure. The LED assembly may comprise two lead frames. The heat sink structure may comprise a plurality of fins. The lead frame may comprise a first portion and a second portion, and a non-conductive support securing the first portion to the second portion. The support may comprise a molded plastic member. At least one electrically non-conductive support may be connected between the at least one anode and the at least one cathode. The lead frame may support a plurality of LEDs where the plurality of LEDs are formed into a cylindrical shape. The lead frame may support a plurality of LEDs where at least one of the LEDs is angled toward a top of the LED assembly. The lead frame may comprise a plurality of LEDs arranged in a first tier and a second plurality of LEDs arranged in a second tier. The lead frame may support a plurality of LEDs where the plurality of LEDs are formed into a polyhedron. The lead frame may support a plurality of LEDs where the plurality of LEDs are formed into a helix.

In some embodiments a lamp comprises an optically transmissive enclosure. An LED assembly is disposed in the optically transmissive enclosure to be operable to emit light when energized through an electrical connection. The LED assembly comprises a metal core board comprising a plurality of LEDs and a heat sink structure. The metal core board is bent into a three-dimensional shape to create a desired light pattern in the enclosure.

In some embodiments a gas may be contained in the enclosure to provide thermal coupling to the LED assembly. A glass stem may be fused to the enclosure supporting the LED assembly. The metal core board may comprise a thermally and electrically conductive core made of a pliable metal material. The core may be covered by a dielectric material. The metal core board may be formed as a flat member having a central band on which a plurality of LED packages containing LEDs are mounted and a heat sink structure extending from the central band. The central band may be divided into sections by thinned areas and the LEDs may be located on the sections such that the metal core board may be bent along the thinned areas. The heat sink structure may comprise fins. The metal core board may be bent into a cylindrical shape. The LEDs may be placed on the metal core board to form a helix. A first plurality of LEDs may be arranged in a first tier and a second plurality of LEDs may be arranged in a second tier. One of the plurality of LEDs may be angled toward a top of the LED assembly.

In some embodiments a lamp comprises an optically transmissive enclosure. An LED assembly is disposed in the optically transmissive enclosure to be operable to emit light when energized through an electrical connection. The LED assembly comprises a metal extruded submount supporting a plurality of LEDs and a heat sink structure coextruded with the submount. The submount is extruded in a three-dimensional shape to create a desired light pattern in the enclosure. A gas is contained in the enclosure to provide thermal coupling to the LED assembly. A glass stem is fused to the enclosure supporting the LED assembly.

In some embodiments a lamp comprises an optically transmissive enclosure. An LED assembly is disposed in the optically transmissive enclosure to be operable to emit light when energized through an electrical connection. The LED assembly comprises a metal core board comprising a plurality of LEDs and a heat sink structure comprising a lead frame. The metal core board and lead frame are bent into a three-dimensional shape to create a desired light pattern in the enclosure.

BRIEF DESCRIPTION OF THE DRAWINGS

In FIG. 3 the lens of the LED lamp is shown as completely transparent to make interior detail visible notwithstanding the fact that a diffusive lens material might be used in some embodiments.

FIG. 5 shows an alternate type of submount and packaged LED devices that can be used.

DETAILED DESCRIPTION

Figure 1:
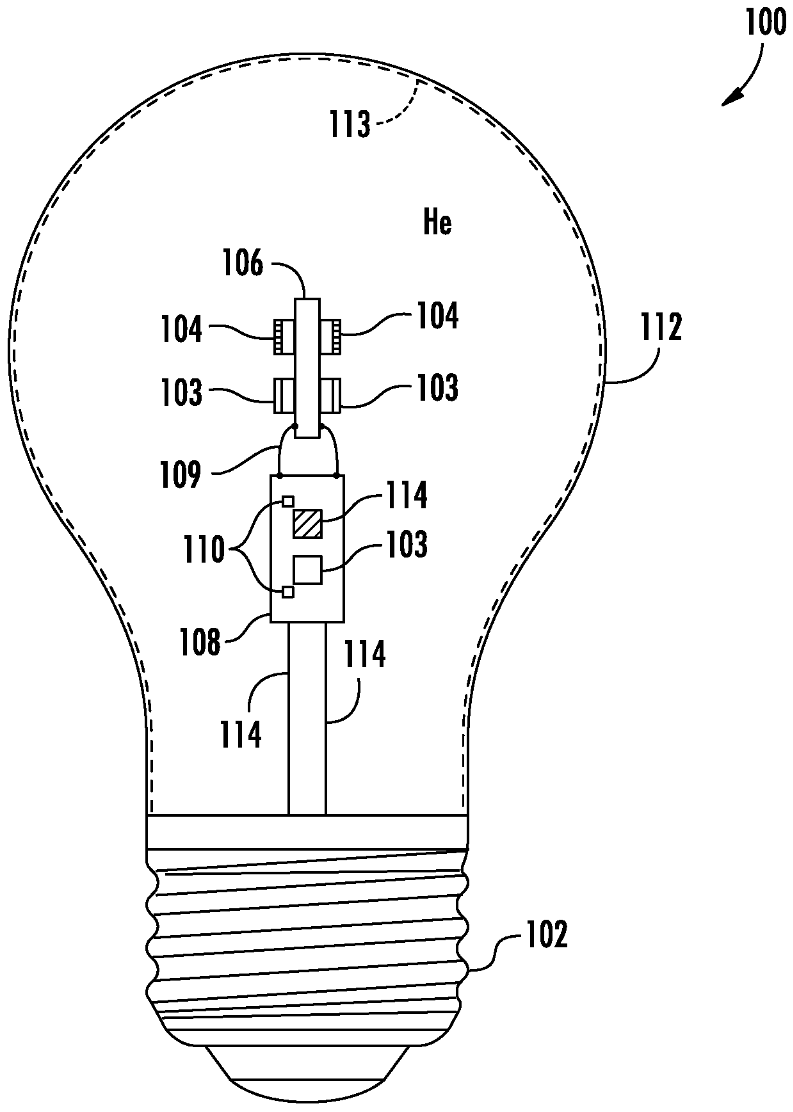
FIG. 1 is a side view of an LED lamp according to embodiments of the invention. The optical enclosure of the lamp is shown as cross-sectioned so that the inter detail may be appreciated.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

Embodiments of the present invention provide a solid-state lamp with centralized light emitters, more specifically, LEDs. Multiple LEDs can be used together, forming an LED array. The LEDs can be mounted on or fixed within the lamp in various ways. In at least some example embodiments, a submount is used. In some embodiments, the submount is light transmissive. A light transmissive submount can be translucent, diffusive, transparent or semi-transparent. The submount can have two or more sides, and LEDs can be included on both or all sides. The centralized nature and minimal and/or light transmissive mechanical support of the LEDs allows the LEDs to be configured near the central portion of the structural envelope of the lamp. In some example embodiments, a gas provides thermal coupling to the LED array in order to cool the LEDs. However, the light transmissive submount can be used with a liquid, a heatsink, or another thermic constituent. Since the LED array can be configured in some embodiments to reside centrally within the structural envelope of the lamp, a lamp can be constructed so that the light pattern is not adversely affected by the presence of a heat sink and/or mounting hardware, or by having to locate the LEDs close to the base of the lamp. If an optically transmissive submount is used, light can pass through the submount making for a more even light distribution pattern in some embodiments. It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture for mounting on walls, in or on ceilings, on posts, and/or on vehicles.

FIG. 1 shows a side view of a lamp, 100, according to some embodiments of the present invention. Lamp 100 is an A-series lamp with an Edison base 102, more particularly; lamp 100 is designed to serve as a solid-state replacement for an A19 incandescent bulb. The LEDs in the LED array include LEDs 103, which are LED die disposed in an encapsulant such as silicone, and LEDs 104, which are encapsulated with a phosphor to provide local wavelength conversion, as will be described later when various options for creating white light are discussed. The LEDs of the LED array of lamp 100 are mounted on multiple sides of a light transmissive submount and are operable to emit light when energized through an electrical connection. The light transmissive submount includes a top portion 106 and a bottom portion 108. The two portions of the submount are connected by wires 109, which provide structural support as well as an electrical connection. The submount in lamp 100 includes four mounting surfaces or "sides," two on each portion. In some embodiments, a driver or power supply is included with the LED array on the submount. In the case of the embodiments of FIG. 1, power supply components 110 are schematically shown on the bottom portion of the submount.

Still referring to FIG. 1, enclosure 112 is, in some embodiments, a glass enclosure of similar shape to that commonly used in household incandescent bulbs. In this example embodiment, the glass enclosure is coated on the inside with silica 113, providing a diffuse scattering layer that produces a more uniform far field pattern. Wires 114 run between the submount and the lamp base 102 to carry both sides of the supply to provide critical current to the LEDs. Base 102 may include a power supply or driver and form all or a portion of the electrical path between the mains and the LEDs. The base may also include only part of the power supply circuitry while some smaller components reside on the submount. The centralized LED array and any power supply components for lamp 100 in enclosure 112 are cooled by helium gas, or another thermal material which fills or partially fills the optically transmissive enclosure 112 and provides thermal coupling to the LED array. The helium may be under pressure, for example the helium may be at 2 atmospheres, 3, atmospheres, or even higher pressures. With the embodiment of FIG. 1, as with many other embodiments of the invention, the term "electrical path" can be used to refer to the entire electrical path to the LED array, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LED array. Likewise the term "electrical connection" can refer to the connection to the LED array, to the power supply, or both.

Figure 2:
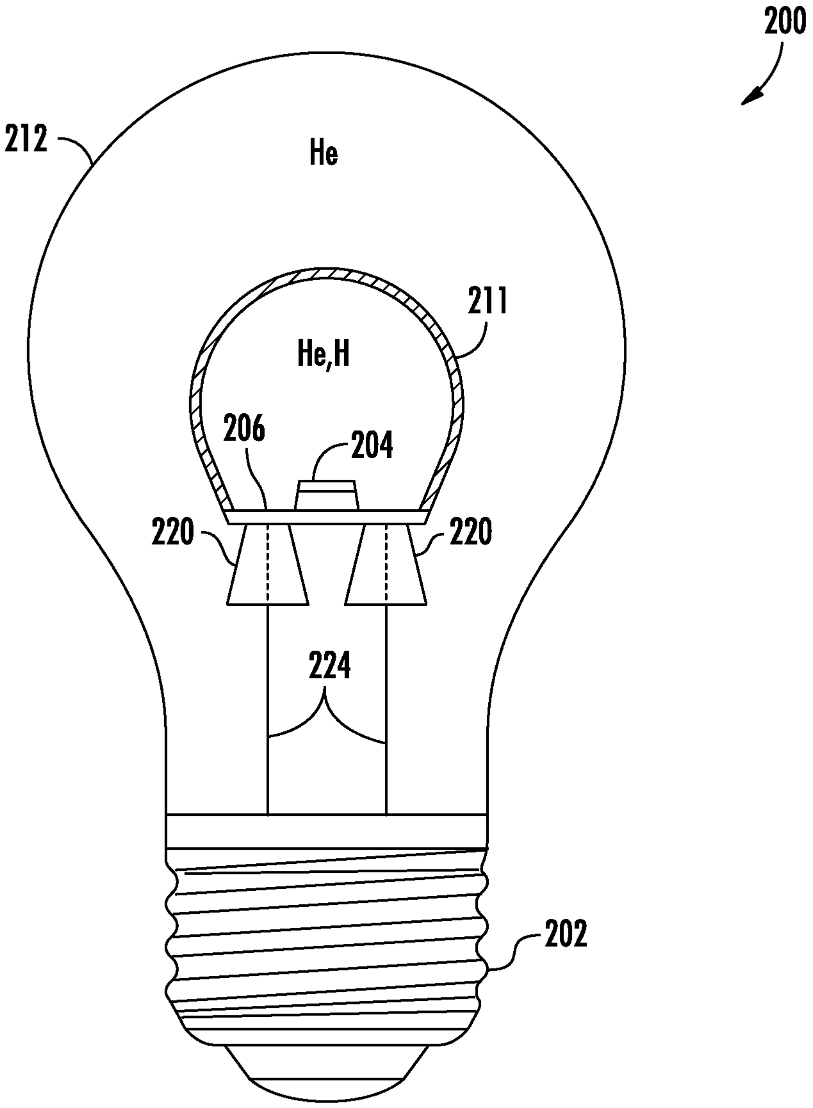
FIG. 2 is a side view of an LED lamp according to other embodiments of the invention. In the case of FIG. 2, the optical enclosure as well as the interior optical envelope of the lamp is shown as cross-sectioned.

FIG. 2 shows a side view of a lamp, 200, according to further embodiments of the present invention. Lamp 200 is again an A-series lamp with an Edison base 202. Lamp 200 includes an LED array that includes a single LED 204 on a submount 206, which may be optically transmissive. Power supply components may be included on the submount or in the base, but are not shown in this case. Lamp 200 includes an optically transmissive inner envelope 211, which is internally or externally coated with phosphor to provide remote wavelength conversion and thus produce substantially white light. The LED array and the power supply for lamp 200 are cooled by a non-explosive mixture of helium gas and hydrogen gas in the inner optical envelope 211 that provides thermal coupling to the LED. Cooling is also provided by helium gas between the inner optical envelope and optical enclosure 212, which again takes the form and shape of the glass envelope of a household incandescent bulb, but can be made out of various materials, including glass with silica coating (not shown) and various types of plastics. For purposes of this disclosure, the outermost optical element of a lamp is typically referred to as an "enclosure" and an internal optical element may be referred to as an "envelope."

Still referring to FIG. 2, lamp 200 includes thermic constituents in addition the above-mentioned gasses. Heatsinks 220 are connected to submount 206 and provide additional coupling between the submount and the helium gas between envelope 211 and enclosure 212. These heatsinks could also be considered part of the submount and/or could actually be formed as part of the submount out of the same material. Each heatsink is a cone-like structure with open space in the center through which wires 224 pass. Wires 224 provide a thermally resistive electrical path between the lamp base and the electronics on submount 206 of lamp 200. The thermal resistance (as opposed to electrical resistance) prevents heat that may be used to seal the lamp during manufacturing from damaging the LEDs and/or the driver for the lamp. Generally, electrical connections for LEDs are designed to minimize thermal resistance to provide additional cooling during operation. However, with the other thermic elements provided to cool the LEDs with embodiments of the invention, the connecting wires to the base can be made thermally resistive to protect the LEDs during manufacture, while still providing power through an electrical connection to the LED and/or the power supply. In the embodiment of FIG. 2, thermal resistance is increased by using small diameter, long wires, but specific wire geometries and/or specific materials can also be used to provide a thermally resistive electrical path to the LED array. It should be noted that a lamp according to embodiments of the invention might include multiple inner envelopes, which can take the form of spheres, tubes or any other shapes.

It should be noted that if a lamp like lamp 200 in FIG. 2 can be the same size as a lamp like that shown in FIG. 1. However, in some embodiments, a lamp like that of FIG. 1 may be designed to be physically smaller than that shown in FIG. 2, for example, lamp 200 of FIG. 2 may have the size and form factor of a standard-sized household incandescent bulb, while lamp 100 of FIG. 1 may have the size and form factor of a smaller incandescent bulb, such as that commonly used in appliances, since space for an inner optical envelope is not required. It should also be noted that in this or any of the embodiments shown here, the optically transmissive enclosure or a portion of the optically transmissive enclosure could be coated or impregnated with phosphor or a diffuser.

Figure 3:
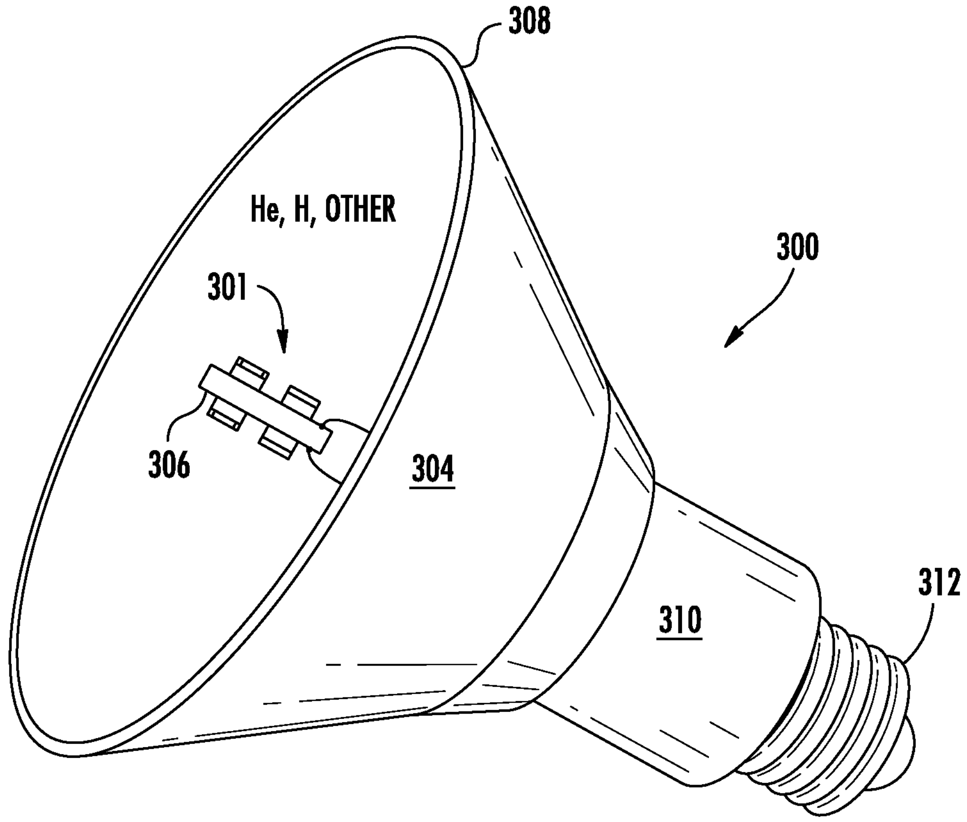
FIG. 3 is a perspective view of an LED lamp according to other embodiments of the invention.

FIG. 3 is a perspective view of a PAR-style lamp 300 such as a replacement for a PAR-38 incandescent bulb. Lamp 300 includes an LED array on submount 301 like that shown in FIG. 1, disposed within an outer reflector 304. The top portion 306 of the submount can be seen through a glass or plastic lens 308, which covers the front of lamp 300. In this case, the power supply (not shown) can be housed in base portion 310 of lamp 300. Lamp 300 again includes an Edison base 312. Reflector 304 and lens 308 together form an optically transmissive enclosure for the lamp, albeit light transmission in this case is directional. Note that a lamp like lamp 300 could be formed with a unitary enclosure, formed as an example from glass, appropriately shaped and silvered or coated on an appropriate portion to form a directional, optically transmissive enclosure. Lamp 300 again includes gas within the optically transmissive enclosure to provide thermal coupling to the LED array and any power supply components that might be included on the submount. In this example embodiment, the gas includes helium and/or hydrogen.

Any of various gasses can be used to provide an embodiment of the invention in which an LED lamp includes gas as a thermic constituent. A combination of gasses can be used. Examples include all those that have been discussed thus far, helium, hydrogen, and additional component gasses, including a chlorofluorocarbon, a hydrochlorofluorocarbon, difluoromethane and pentafluoroethane. Gasses with a thermal conductivity in milliwatts per meter Kelvin (mW/m-K) of from about 60 to about 180 can be made to work well. For purposes of this disclosure, thermal conductivities are given at standard temperature and pressure (STP). Helium gas has a thermal conductivity of about 142, and hydrogen gas has a thermal conductivity of about 168. Gasses can be used with an embodiment of the invention where the gas has a thermal conductivity of at least about 60 mW/m-K, at least about 70 mW/m-K, at least about 150 mW/m-K, from about 60 to about 180 mW/m-K, or from about 70 to about 150 mW/m-K.

A gas used for cooling in example embodiments of the invention can be pressurized, either negatively or positively. In fact, a gas inserted in the enclosure or internal optical envelope at atmospheric pressure during manufacturing may end up at a slight negative pressure once the lamp is sealed. Under pressure, the thermal resistance of the gas may drop, enhancing cooling properties. The gas inside a lamp according to example embodiments of the invention may be at any pressure from about 0.5 to about 10 atmospheres. It may be at a pressure from about 0.8 to about 1.2 atmospheres, at a pressure of about 2 atmospheres, or at a pressure of about 3 atmospheres. The gas pressure may also range from about 0.8 to about 4 atmospheres.

It should also be noted that a gas used for cooling a lamp need not be a gas at all times. Materials which change phase can be used and the phase change can provide additional cooling. For example, at appropriate pressures, alcohol or water could be used in place of or in addition to other gasses. Porous substrates, envelopes, or enclosure can be used that act as a wick. The diffuser on the lamp can also act as the wick.

Referring to FIGS. 10 through 21 embodiments of a lamp 1000 and an embodiment of a method of making a lamp will be described. The lamp 1000 comprises an enclosure 1112 that is, in some embodiments, a glass, quartz, borosilicate, silicate or other suitable material. In some embodiments, the enclosure is of a similar shape to that commonly used in household incandescent bulbs. The glass enclosure may be coated on the inside with silica 1113, or other surface treatment, to provide a diffuse scattering layer that produces a more uniform far field pattern or the surface treatment may be omitted and a clear enclosure may be provided. The glass enclosure 1112 may have a traditional bulb shape having a globe shaped main body 1114 that tapers to a narrower neck 1115. A lamp base 1102 such as an Edison base may be connected to the neck 1115 where the base functions as the electrical connector to connect the lamp 1000 to an electrical socket or other connector. Depending on the embodiment, other base configurations are possible to make the electrical connection such as other standard bases or non-traditional bases.

A glass stem 1120 is fused to the glass enclosure 1112 in the area of neck 1115. The glass stem 1120 may comprise a generally hollow outer dome 1121 having a first end that extends into the body 1114 and a second end that is fused to the enclosure 1112 such that the interior of the enclosure 1112 is sealed from the external environment. A tube 1126 having an internal passageway 1123 extends through the interior of dome 1121. An annular cavity 1125 is created between the tube 1126 and dome 1121. Wires 1150 may extend between the LED assembly 1130 and base 1102 through the annular cavity 1125.

Figure 17:
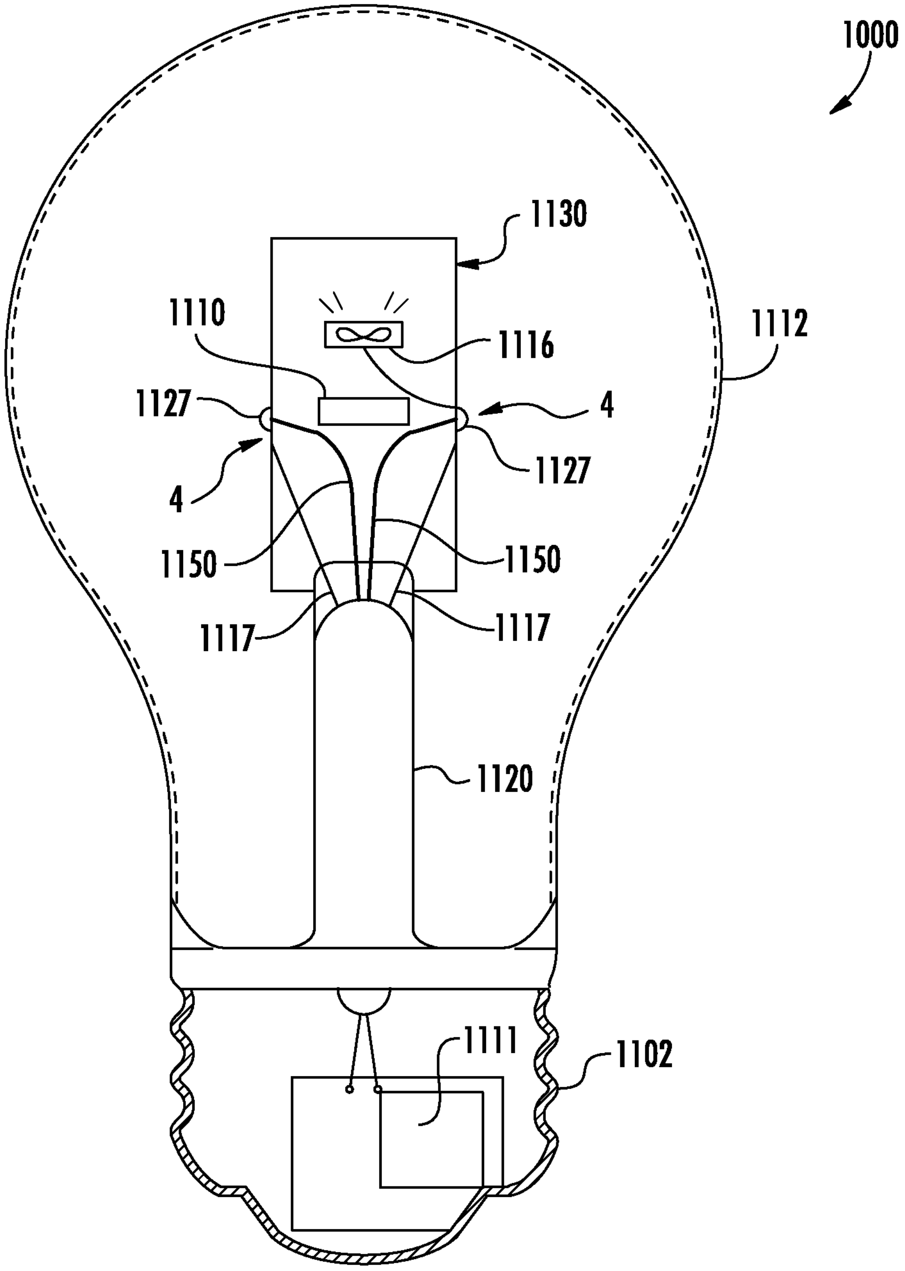
FIG. 17 is a schematic side view of another embodiment of the lamp of FIG. 10.
Figure 18:
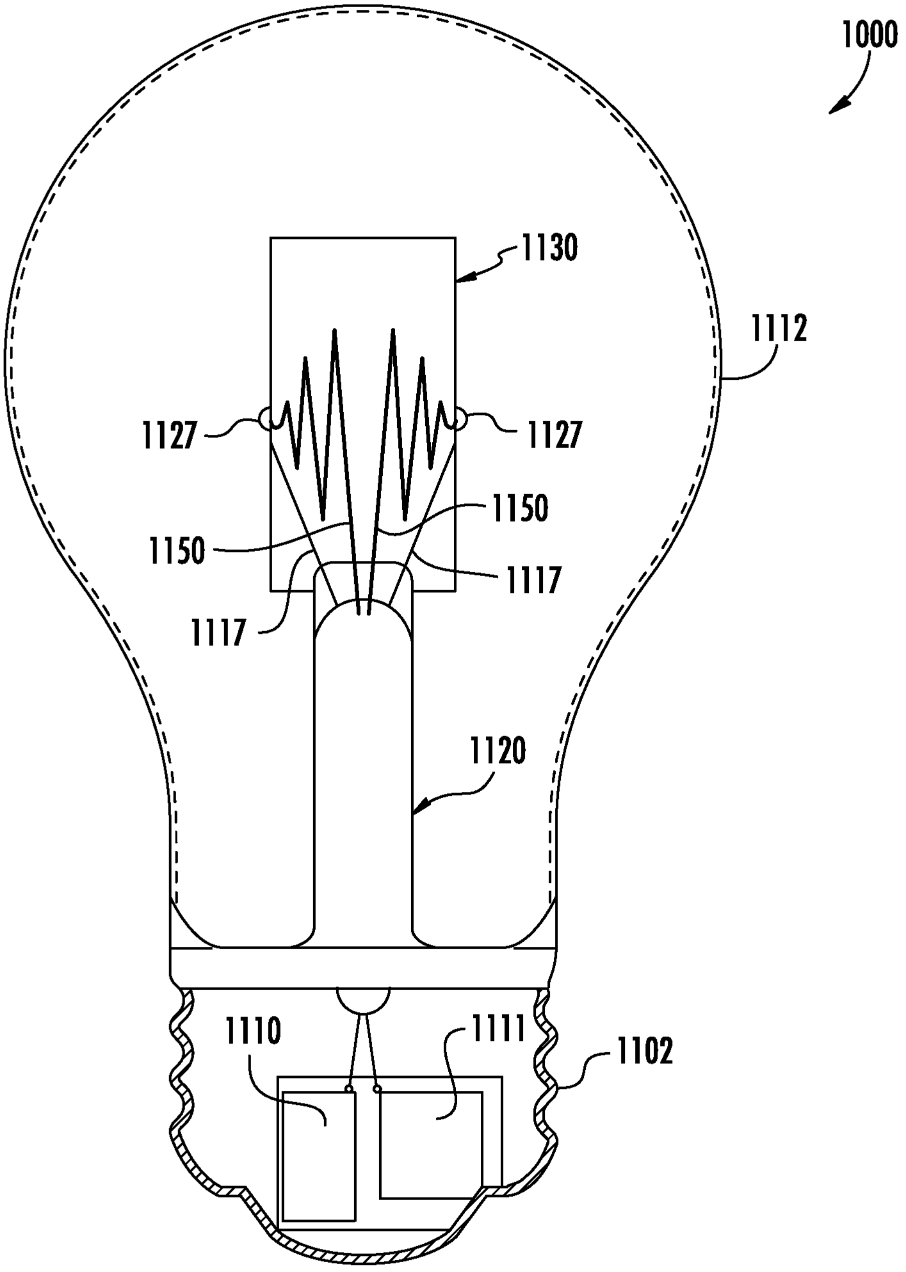
FIG. 18 is a schematic side view of yet another embodiment of the lamp of FIG. 10.
Figure 19:
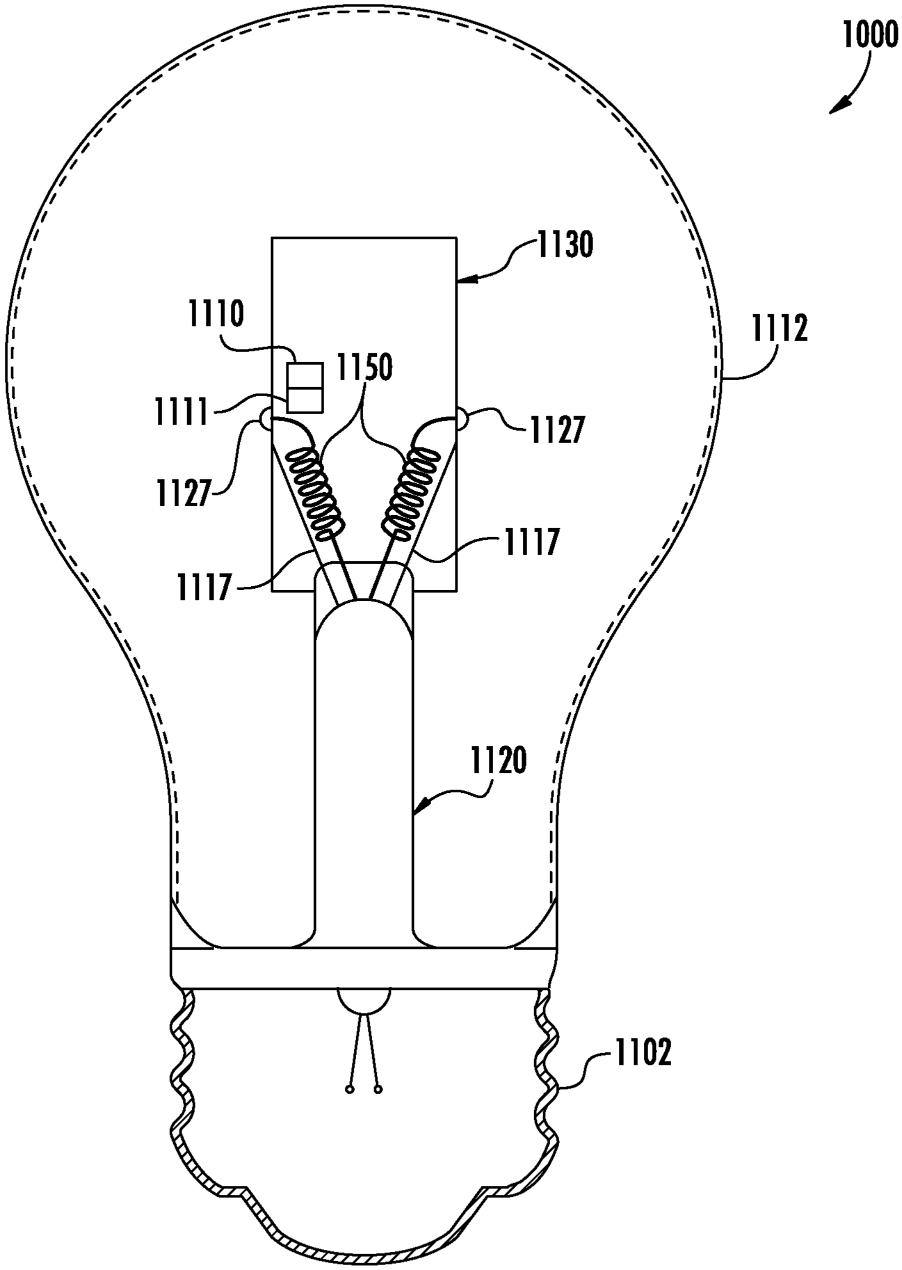
FIG. 19 is a schematic side view of still another embodiment of the lamp of FIG. 10.

The lamp 1000 comprises a solid-state lamp comprising a LED assembly 1130 with light emitting LEDs 1127. Multiple LEDs 1127 can be used together, forming an LED array 1128. The LEDs 1127 can be mounted on or fixed within the lamp in various ways. In at least some example embodiments, a submount 1129 is used. The LEDs 1127 in the LED array 1128 include LEDs which may comprise an LED die disposed in an encapsulant such as silicone, and LEDs which may be encapsulated with a phosphor to provide local wavelength conversion, as will be described later when various options for creating white light are discussed. A wide variety of LEDs and combinations of LEDs may be used in the LED assembly 1130 as described herein. The LEDs 1127 of the LED array 1128 of lamp 1000 may be mounted on multiple sides of submount 1129 and are operable to emit light when energized through an electrical connection. Wires 1150 run between the submount 1129 and the lamp base 1102 to carry both sides of the supply to provide critical current to the LEDs 1127. The wires 1150 may be used to both supply current to the LEDs and to physically support the LEDs on the stem 1120. In some embodiments, a driver 1110 and/or power supply 1111 are included with the LED array on the submount 1129 as shown in FIG. 19. In other embodiments the driver 1110 and/or power supply 1111 are included in the base 1102 as shown in FIG. 18. The power supply 1111 and drivers 1110 may also be mounted separately where components of the power supply 1111 are mounted in the base 1102 and the driver 1110 is mounted with the submount 1129 in the enclosure 1112 as shown in FIG. 17. Base 1102 may include a power supply 1111 or driver 1110 and form all or a portion of the electrical path between the mains and the LEDs 1127. The base 1102 may also include only part of the power supply circuitry while some smaller components reside on the submount 1129. In some embodiments any component that goes directly across the AC input line may be in the base 1102 and other components that assist in converting the AC to useful DC may be in the glass enclosure 1112. In one example embodiment, the inductors and capacitor that form part of the EMI filter are in the Edison base. Suitable power supplies and drivers are described in U.S. patent application Ser. No.

13/462,388 filed on May 2, 2012 and titled "Driver Circuits for Dimmable Solid State Lighting Apparatus" which is incorporated herein by reference in its entirety; U.S. patent application Ser. No. 12/775,842 filed on May 7, 2010 and titled "AC Driven Solid State Lighting Apparatus with LED String Including Switched Segments" which is incorporated herein by reference in its entirety; U.S. patent application Ser. No. 13/192,755 filed Jul. 28, 2011 titled "Solid State Lighting Apparatus and Methods of Using Integrated Driver Circuitry" which is incorporated herein by reference in its entirety; U.S. patent application Ser. No. 13/339,974 filed Dec. 29, 2011 titled "Solid-State Lighting Apparatus and Methods Using Parallel-Connected Segment Bypass Circuits" which is incorporated herein by reference in its entirety; U.S. patent application Ser. No. 13/235,103 filed Sep. 16, 2011 titled "Solid-State Lighting Apparatus and Methods Using Energy Storage" which is incorporated herein by reference in its entirety; U.S. patent application Ser. No. 13/360,145 filed Jan. 27, 2012 titled "Solid State Lighting Apparatus and Methods of Forming" which is incorporated herein by reference in its entirety; U.S. patent application Ser. No. 13/338,095 filed Dec. 27, 2011 titled "Solid-State Lighting Apparatus Including an Energy Storage Module for Applying Power to a Light Source Element During Low Power Intervals and Methods of Operating the Same" which is incorporated herein by reference in its entirety; U.S. patent application Ser. No. 13/338,076 filed Dec. 27, 2011 titled "Solid-State Lighting Apparatus Including Current Diversion Controlled by Lighting Device Bias States and Current Limiting Using a Passive Electrical Component" which is incorporated herein by reference in its entirety; and U.S. patent application Ser. No. 13/405,891 filed Feb. 27, 2012 titled "Solid-State Lighting Apparatus and Methods Using Energy Storage" which is incorporated herein by reference in its entirety.

The AC to DC conversion may be provided by a boost topology to minimize losses and therefore maximize conversion efficiency. The boost supply is connected to high voltage LEDs operating at greater than 200V.

The LED assembly 1130 also may be physically supported by the stem 1120. A tube 1133 extends beyond the end of the hollow stem 1120. In one embodiment the tube 1133 and stem 1120 are formed of glass and may be formed as a one-piece member. The tube 1133 comprises a passageway 1135 that receives a post 1137 formed on a support 1143. Support 1143 further comprises a plurality of radially extending arms 1139 that are supported by the post 1137. The arms 1139 may extend from the post 1137 in a star pattern where, for example, about six arms are provided. The exact number of arms 1139 may be dictated by the amount of support required for a particular LED assembly. In one embodiment the post 1137 and arms 1139 may be formed as one-piece from molded plastic. The arms 1139 engage the LED assembly 1130 to support the LED assembly on stem 1120. In one embodiment the arms 1139 are inserted between fins 1141 formed on LED assembly 1130 such that the LED assembly is constrained from movement. The wires 1150 may be used to maintain the LED assembly 1130 in position on the support 1143 and to maintain the support 1143 in tube 1133. The LED assembly 1130 may also be supported by separate support wires 1117 that are fused into the glass stem 1120 and are connected to the LED assembly as shown in FIG. 17. While two support wires 1117 are shown a greater number of support wires may be used to provide three-dimensional support for the LED assembly 1130. Moreover, support wires 1117 and support 1143 may be used in combination. Further, if wires 1150 adequately support the LED assembly 1130, the support 1143 and/or support wires 1117 may be eliminated.

The use of a glass stem 1120 to support the LED assembly 1130 is counter to LED lamp design because glass is thermally insulating. Typically, the LEDs in a lamp are supported on a metal support that thermally connects the LEDs to the base 1102 and/or to an associated heat sink such that heat generated by the LEDs may be conducted away from the LEDs and dissipated from the lamp via the metal support, the base and/or the heat sink. Because glass stem 1120 is not thermally conductive it will not efficiently conduct heat away from the LEDs 1127. Because thermal management is critical for the operation of LEDs such an arrangement has not been considered suitable for an LED lamp.

The inventors of the present invention have discovered that the centralized LED array 1128 and any co-located power supply and/or drivers for lamp 1000 may be adequately cooled by helium gas, hydrogen gas, and/or another thermal material which fills the optically transmissive enclosure 1112 and provides thermal coupling to the LEDs 1127. The thermal material may comprise a combination of gasses such as helium and oxygen, or helium and air, or helium and hydrogen, or helium and neon or other combination of gases. In a preferred embodiment the thermal conductivity of the combined gases is at least about 60 mW/m-K. The helium, hydrogen or other gas may be under pressure, for example the pressure of the helium or other gas may be greater than 0.5 atmosphere. The pressure of the helium or other gas may be greater than 1 atmosphere. The helium or other gas may be about 2 atmospheres, about 3 atmospheres, or even higher pressures. In some embodiments the gas pressure may be in a range from about 0.5 to 1 atmosphere, about 0.5 to 2 atmospheres, about 0.5 to 3 atmospheres, or about 0.5 to 10 atmospheres. Because the gas adequately cools the LEDs, the lamp 1000 may use a traditional glass stem 1120 to support the LED assembly 1130.

To facilitate the cooling of the LEDs 1127, the LEDs may be mounted on a thermally conductive submount 1129 that improves and increases the heat transfer between the thermal gas contained in enclosure 1112 and the LEDs 1127. The submount 1129 may comprise heat sink structure 1149 comprising a plurality of fins or other similar structure 1141 that increases the surface area of contact between the heat sink and the thermal gas in enclosure 1112.

In some embodiments a gas movement device 1116 may be provided to move the thermal gas within the enclosure 1112 to increase the heat transfer between the LEDs 1127, LED array 1128, submount 1129, and/or heat sink 1149 of LED assembly 1130 and the thermal gas contained in enclosure 1112 as shown in FIG. 17. The movement of the gas over the LED assembly 1130 moves the gas boundary layer on the components of the LED assembly. In some embodiments the gas movement device 1116 comprises a small fan. The fan may be connected to the power source that powers the LEDs 1127. Tests have shown that by moving the thermal gas inside the enclosure 1112, the temperature in the enclosure may be reduced by 40° C. (Tjunction reduced from ~125 C to 85 C). Reducing the temperature provides a significant increase in thermal management. Use of a gas movement device 1116 also allows the surface area of the LED assembly 1130 to be reduced thereby reducing the cost of the lamp. While the gas movement device 1116 may comprise an electric fan, the gas movement device 1116 may comprise a wide variety of apparatuses and techniques to move air inside the enclosure such as a rotary fan, a piezioelectric fan, corona or ion wind generator, synjet diaphragm pumps or the like.

Figure 11:
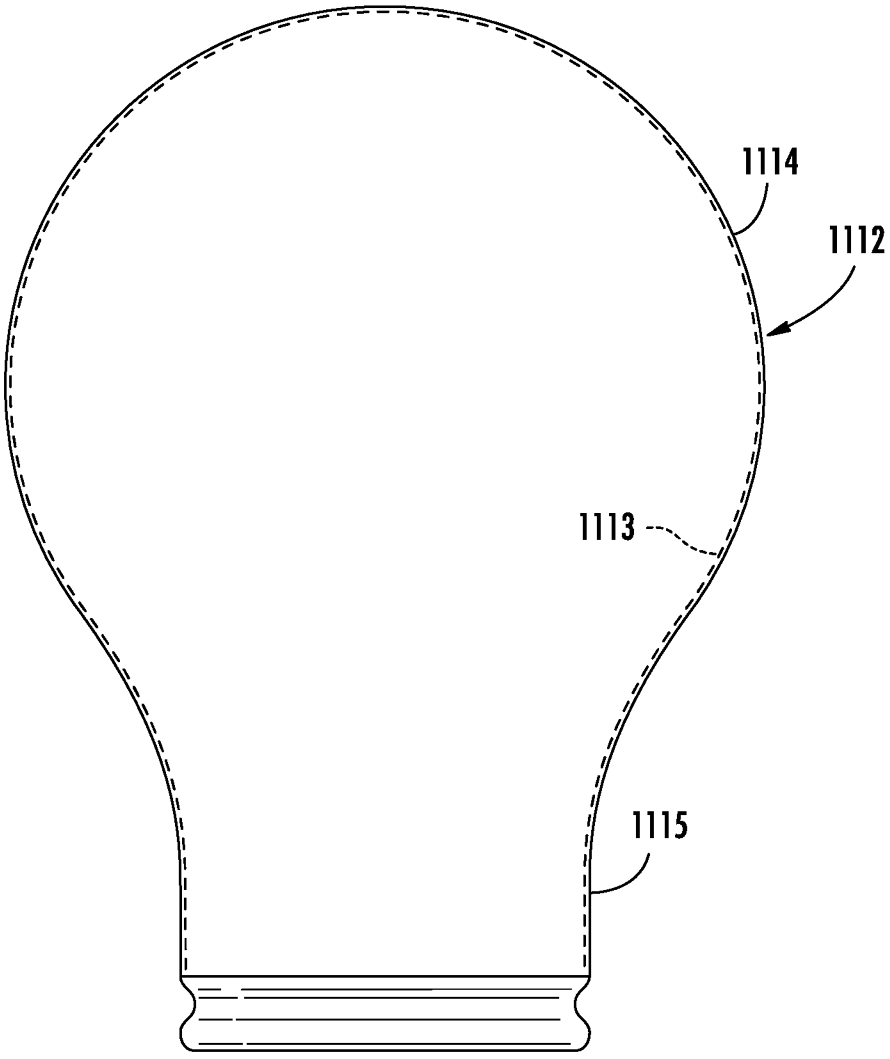
FIG. 11 is a side view of an embodiment of an enclosure usable in the manufacture of the embodiment of FIG. 10.

To further explain the structure and operation of the lamp 1000 an embodiment of a method of making a lamp will be described. Referring to FIG. 11, an enclosure 1112 may be created having a main body 1114 and a relatively narrow neck 1115. In one embodiment the enclosure 1112 is made of glass and may be coated by silica 1113 or other coating as explained herein. The enclosure 1112 may have the form of an incandescent bulb, PAR lamp, or other existing form factor.

Figure 12:
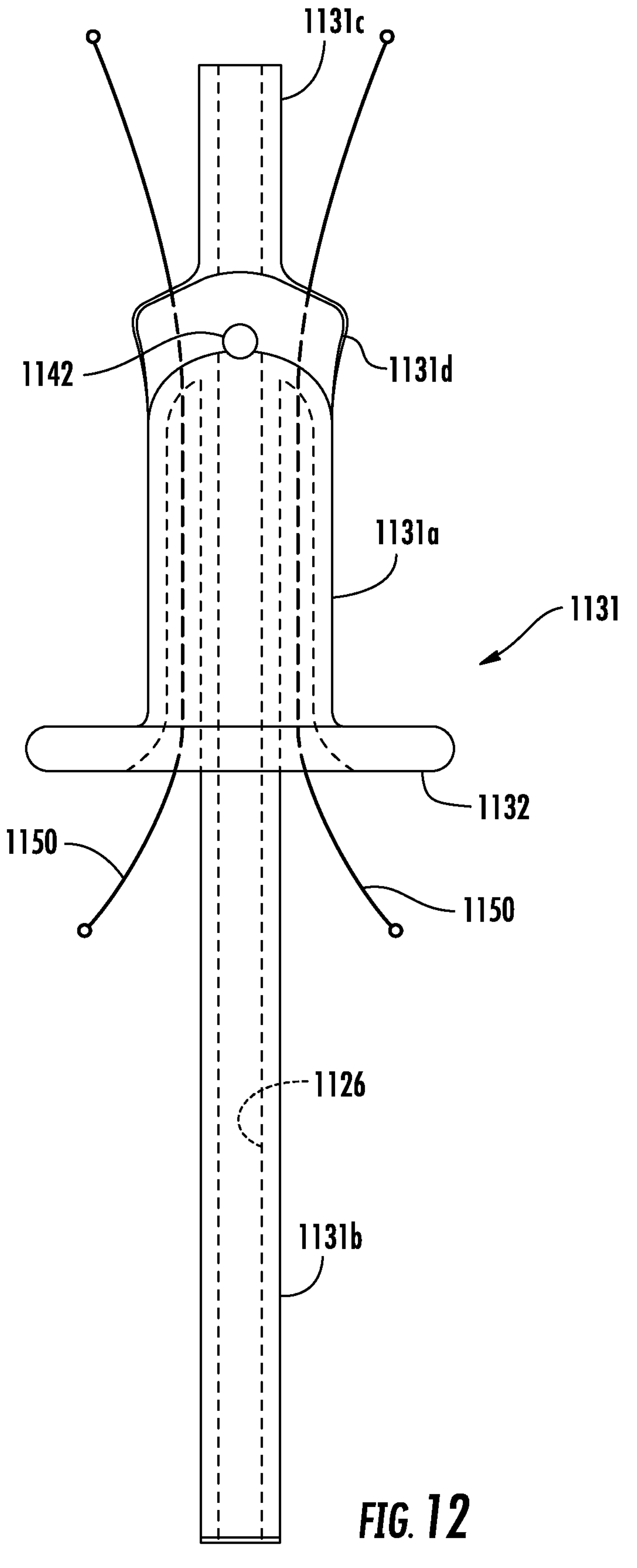
FIG. 12 is a side view of an embodiment of a stem part usable in the manufacture of the embodiment of FIG. 10.

Referring to FIG. 12, a glass stem part 1131 is provided that forms glass stem 1120, tube 1126, and tube 1133 in lamp 1000. Stem part 1131 comprises a tube having a flared first portion 1131*a* that extends into the enclosure 1112 and forms stem 1120 in the finished lamp as described with reference to FIG. 10. The stem part 1131 comprises a second portion 1131*b* that is a tube that is an extension of tube 1126 located inside of stem 1120. Second portion 1131*b* extends outside of the enclosure 1112 during manufacture of the lamp and is substantially removed from the finished lamp. Located between the first portion 1131*a* and the second portion 1131*b* is a glass flange or disc 1132 that protrudes radially from the dome 1121. The flange 1132 is dimensioned such that it substantially fills the open area of the neck 1115. A third portion 1131*c* extends from the first portion 1131*a* and defines tube 1133 and internal bore 1135 in lamp 1000. To make the stem part 1131 the area 1131*d* between the first portion 1131*a* and the third portion 1131*c* is fused such that the passage 1126 is blocked between the first portion 1131*a* and the third portion 1131*c*. A pair of holes 1142 are formed in the area of fused portion 1131*d* that communicate passageway 1126 with the exterior of the stem part 1131 such that when the stem part 1131 is secured to the enclosure 1112 the interior of the enclosure is in communication with the exterior of the enclosure via the passage 1126 and holes 1142. The holes 1142 may be formed by creating thin portions in the stem and blowing out the thinned portions by introducing gas under pressure into passageway 1126. The wires 1150 for powering the LEDs may extend through and fused into area 1131*d* such that the wires extend from outside the stem part 1131 through annular cavity 1125 and out the stem part 1131 adjacent flange 1132. If used, the support wires 1117 may be embedded in the fused area 1131*d*.

Figure 13:
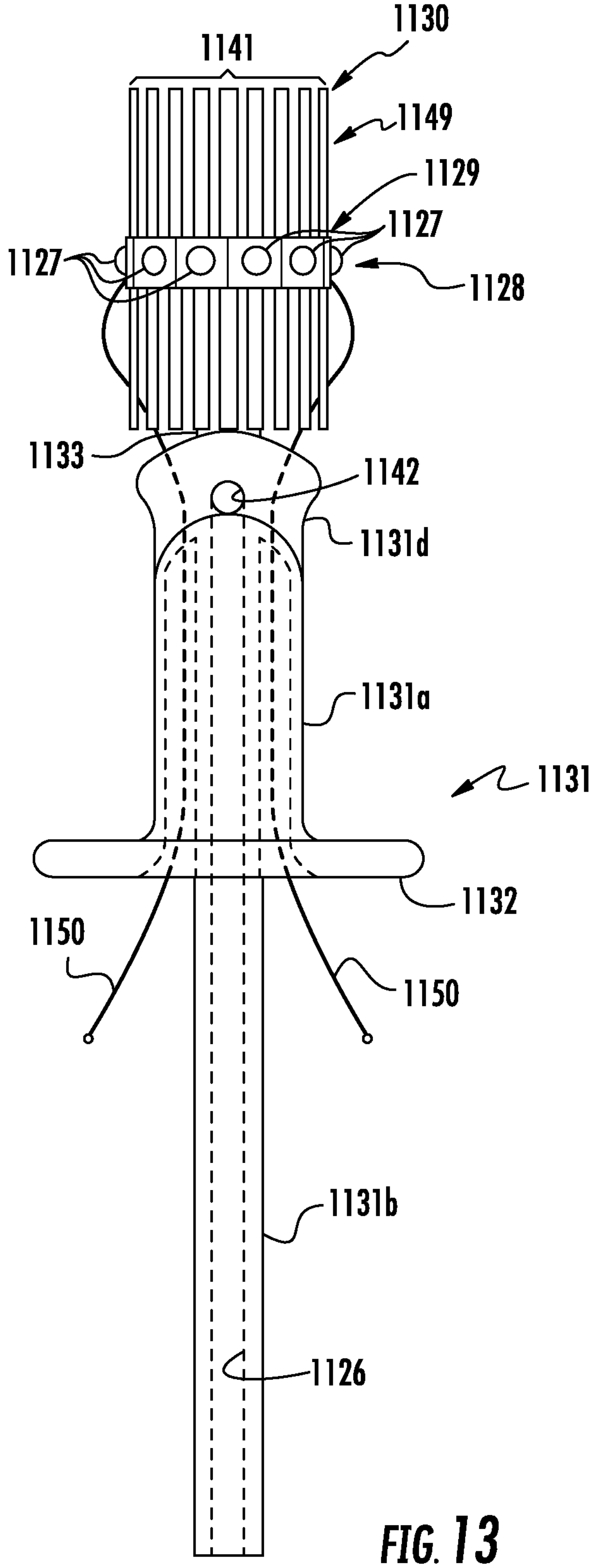
FIG. 13 is a side view of an embodiment of a stem part and LED assembly usable in the manufacture of the embodiment of FIG. 10.

Referring to FIG. 13, an LED assembly 1130 is mounted to the stem part 1131 by support wires 1121, wires 1150 and/or support 1143. The LED assembly 1130 may comprise the LED array 1128, the submount 1129, the heat sink structure 1149, the driver and/or power supply, and/or the gas movement device 1116 as previously described. The wires 1150 are connected to the LED assembly 1130 for delivering current to the LEDs 1127. The wires 1150 extend from the LED assembly 1130 through the stem part 1131 to be connected to the electronics in the base 1102. The LEDs 1127 are positioned in the LED assembly 1130 and the LED assembly 1130 is positioned in the enclosure 1112 such that a desired light pattern is generated by the LEDs and lamp 1000. For a replacement incandescent bulb the LEDs 1127 may be centrally located in the enclosure 1112 such that the light is emitted from the enclosure substantially uniformly about the surface of the enclosure. The lamp may also comprise a directional lamp such as BR-style lamp or a PAR-style lamp where the LEDs may be arranged to provide directional light.

Figure 14:
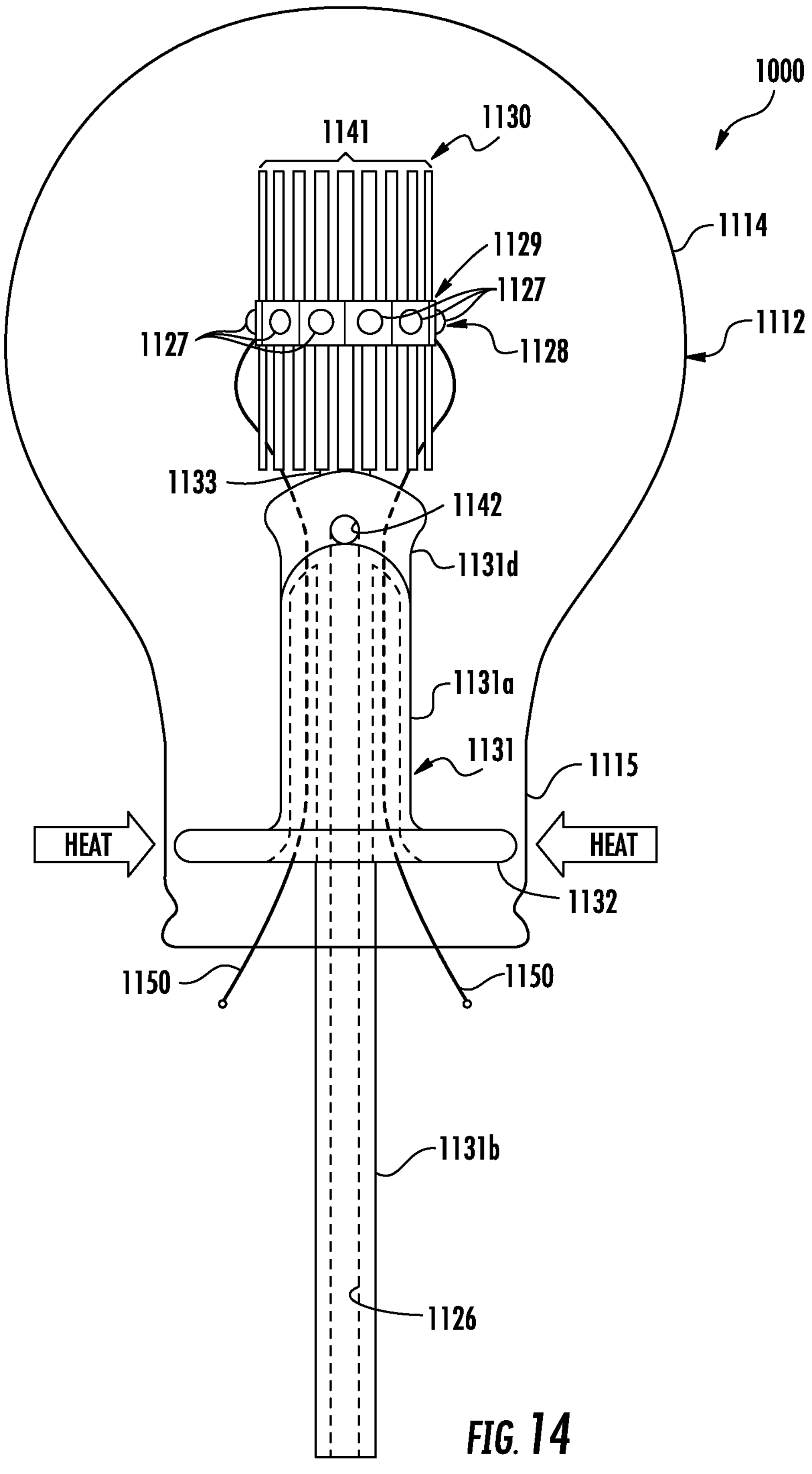
FIG. 14 is a side view of an embodiment of a stem part and LED assembly of FIG. 12 disposed in the enclosure of FIG. 11 showing the manufacture of the embodiment of FIG. 10.
Figure 15:
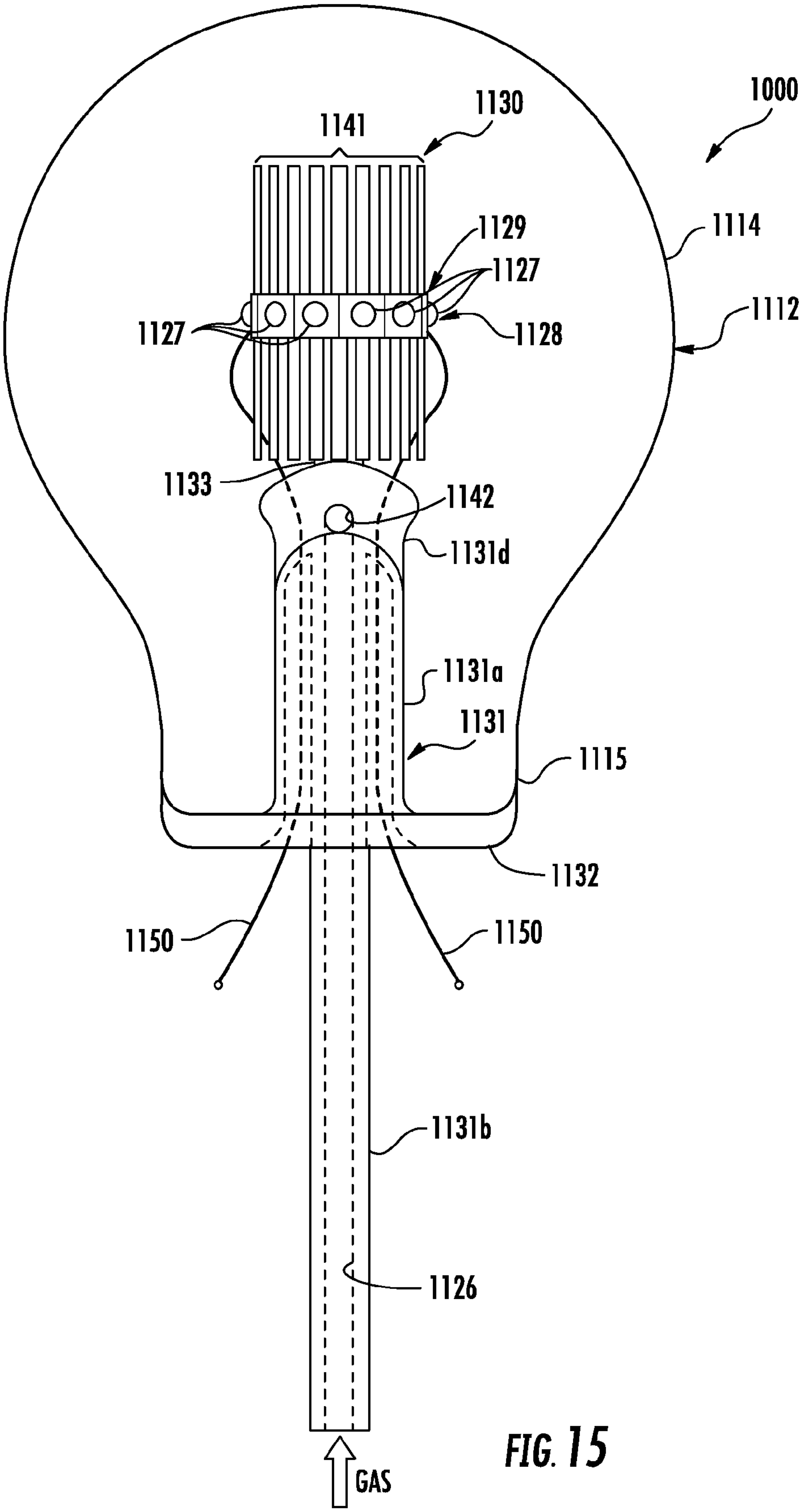
FIG. 15 is a side view of an embodiment of a stem part and LED assembly of FIG. 12 fused to the enclosure of FIG. 11 showing the manufacture of the embodiment of FIG. 10.

Referring to FIG. 14, the stem part 1131 with the LED assembly 1130 is inserted into the enclosure 1112 such that the flange 1132 is disposed in the lamp neck 1115 and the LED assembly 1130 is positioned in the body 1114. The stem portion 1131*b* and wires 1150 extend from the enclosure 1112. The neck 1115 and flange 1132 are heated. The glass becomes molten and the flange 1132 is fused to the neck 1115 such that an air tight seal is created to isolate the interior of the enclosure 1112 from the exterior of the enclosure as shown in FIG. 15. The heating process may be performed in a gas pressurized mandrel such that the neck and flange are formed into a desired shape. After fusing the enclosure 1112 to the stem part 1131 communication between the interior of the enclosure 1112 and the exterior of the enclosure may only be made through the passage 1126 and holes 1142.

Because the LEDs 1127 and LED assembly 1130 are heat sensitive the application of heat to fuse the stem part 1131 to the enclosure 1112 may cause an overtemperature situation for the LED assembly 1130. Overtemperature is a concern for at least two reasons. First, overtemperature may degrade the performance of the LEDs 1127 in use such as by substantially shortening LED life. Overtemperature may also affect the solder connection between the LEDs 1127 and the PCB, base or other submount where the LEDs may loosen or become dislodged from the LED assembly 1130. Overtemperature may be caused by a combination of both peak temperature and the length of time the LED assembly 1130 is exposed to heat. Overtemperature as used herein means a heating of the LED assembly 1130 or LEDs 1127 such that either the performance of the LEDs is degraded or the solder connection is degraded or both. It is desired when attaching the stem part 1131 to the enclosure 1112 that heat transferred to the LEDs 1127 during the fusing process is minimized. The fusing operation occurs at approximately 800 degrees C. and the temperature of the LED array and LEDs must typically be maintained below 325 degrees C. Depending upon the type of LED and its construction in some embodiments the temperature of the LED array and LEDs must be maintained below 300 degrees C., 275 degrees C., 250 degrees C., 235 degrees C., and 215 degrees C. The time of exposure of the heat must also be controlled depending upon the reflow characteristics of the solder and the LED assembly specifications. The overall cycle time of the fusing operation is approximately 15 seconds to 45 seconds in duration, with the glass in the molten stage for 5 to 15 seconds. Prior to the molten stage the glass to be fused is preheated so that residual stress is not incorporated into the assembly. The thermal resistance of the electrical path is selected so as to not cause overtemperature for the duration of the heating process such that the long-term operation of the LEDs and/or the bonds to the submount are not degraded. The temperature at the LEDs should be maintained at least below the temperature and time period where the LED remains bonded to the submount and/or does not fall apart or degrade. Depending on the particular LEDs and bonding materials, these temperatures may vary. Additionally, these temperatures may change depending on the time duration of the exposure to the elevated temperatures.

Figure 20:
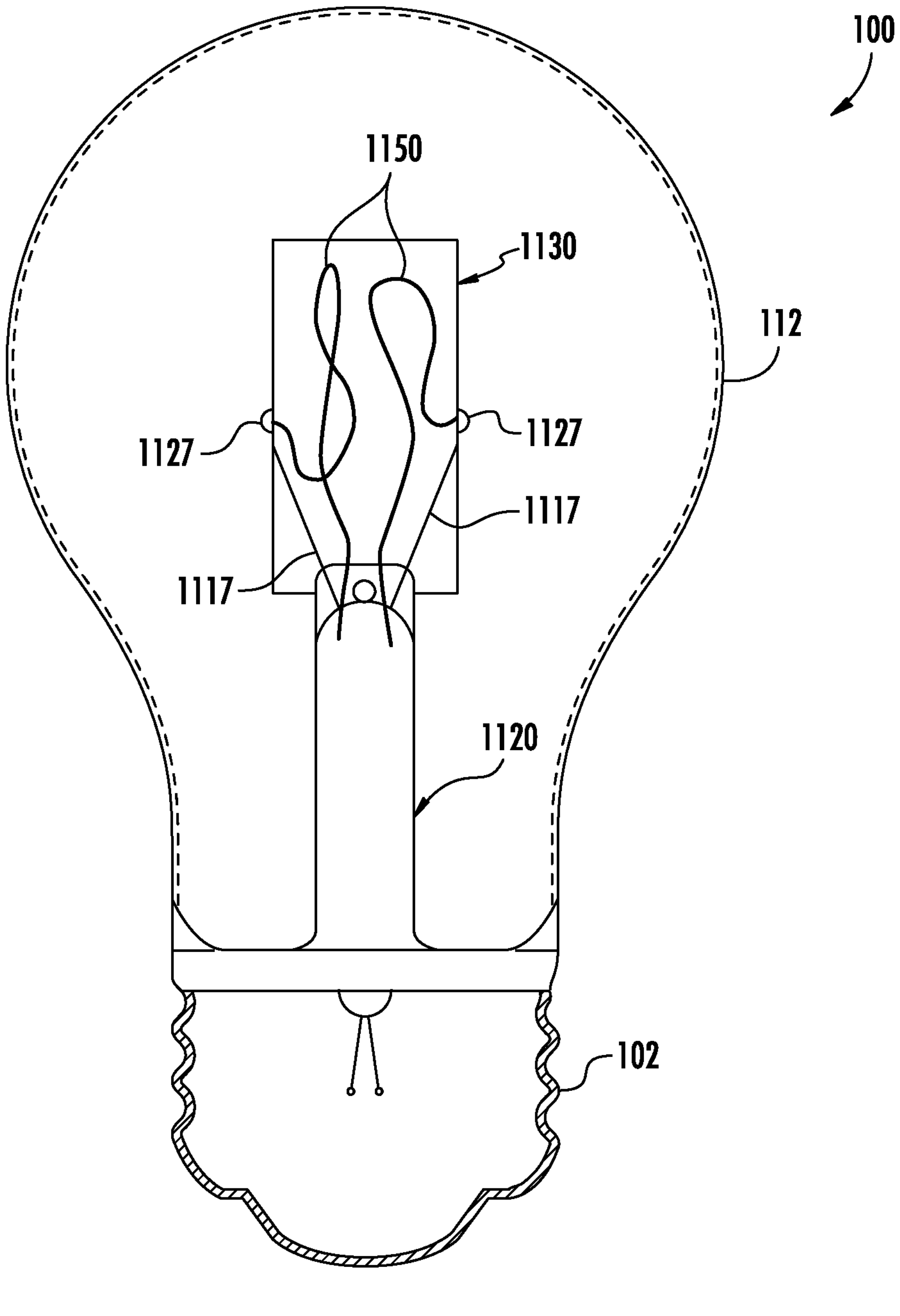
FIG. 20 is a schematic side view of yet another embodiment of the lamp of FIG. 10.

The inventors of the present invention have determined that during the fusing operation the transfer of heat to the LEDs results primarily from heat conduction through the wires 1150 rather than heat convection through the ambient environment. The inventors have concluded that by increasing the thermal resistance through the wires 1150 and/or by increasing the thermal resistance of the electrical path from the connection point of the wires 1150 to the LED assembly 1130 and the LEDs 1127, the heat transfer to the LEDs during the fusing operation may be maintained below overtemperature levels. Increasing the thermal resistance of the wires 1150 may be accomplished using a variety of techniques. In one embodiment the thermal resistance of the wires is increased by increasing the length of the wires. The wire length may be increased by simply making the wires 1150 longer as shown in FIG. 17 such that the distance between the connection point A of the wires 1150 to the LEDs 1127 and the point on the stem part 1131 where the heat is applied is great enough that overtemperature does not occur. The wire length may also be increased by adding length to the wires without increasing the distance between these points. For example, as shown in FIG. 18 the wires 1150 may be formed with a zigzag pattern. Similarly, the wires 1150 may be formed as a helix or coil as shown in FIG. 19. The wires 1150 may be formed with a torturous, circuitous or random pattern as shown in FIG. 20. The wires 1150 may be formed with a combination of such shapes. In these embodiments, the path of the wires, and therefore the thermal resistance, may be increased without increasing the overall distance between the point of application of the heat and the connection point A between the wires 1150 and the LED assembly 1130.

Thermal resistance of the wires may also be increased by making the cross-sectional area of the wires thin enough that the heat does not cause an overtemperature. The thermal resistance of the wires may also be increased by a combination of making the cross-sectional area of the wires thinner and increasing the length of the wire path.

Figure 21:
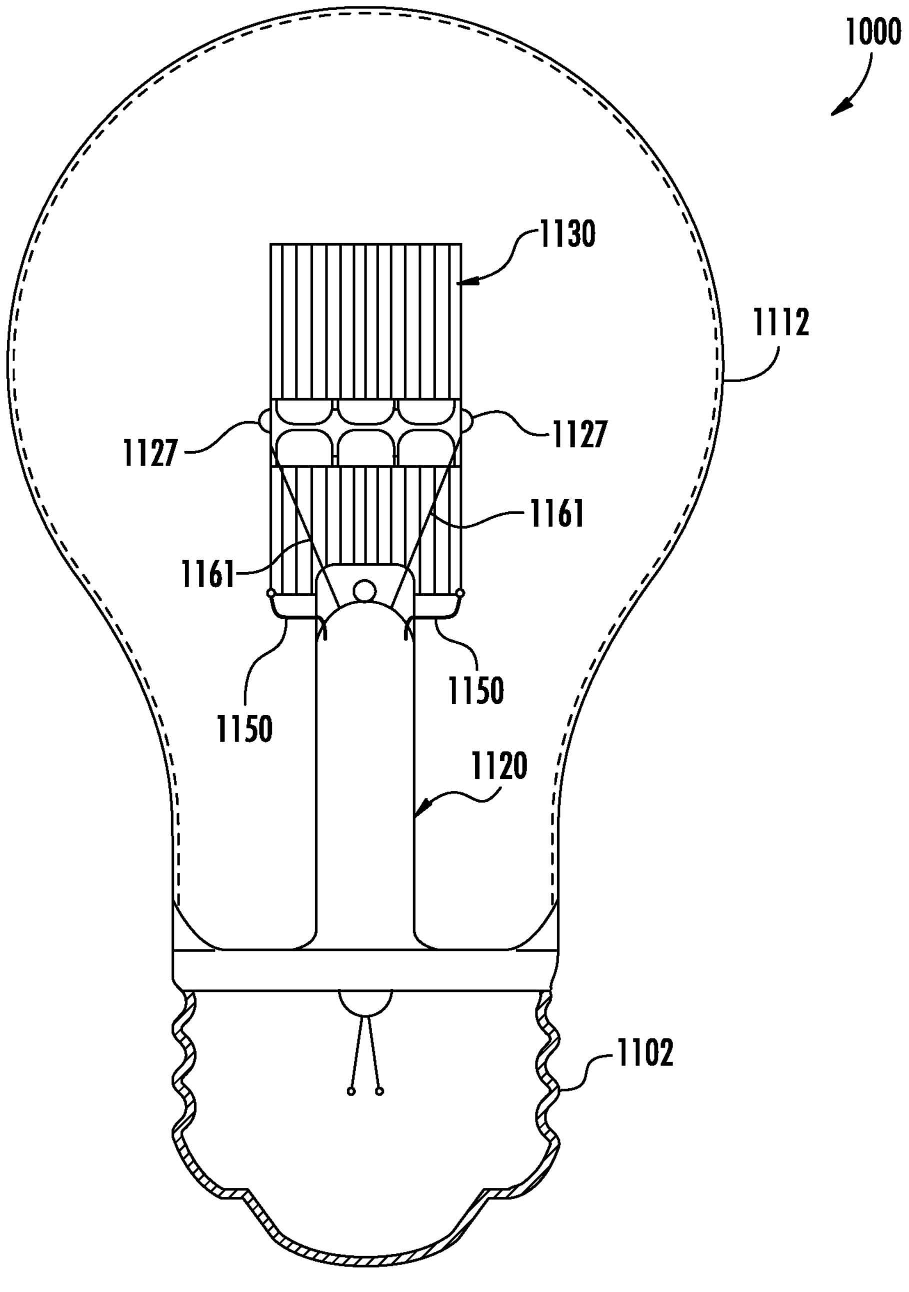
FIG. 21 is a schematic side view of still another embodiment of the lamp of FIG. 10.
Figure 22:
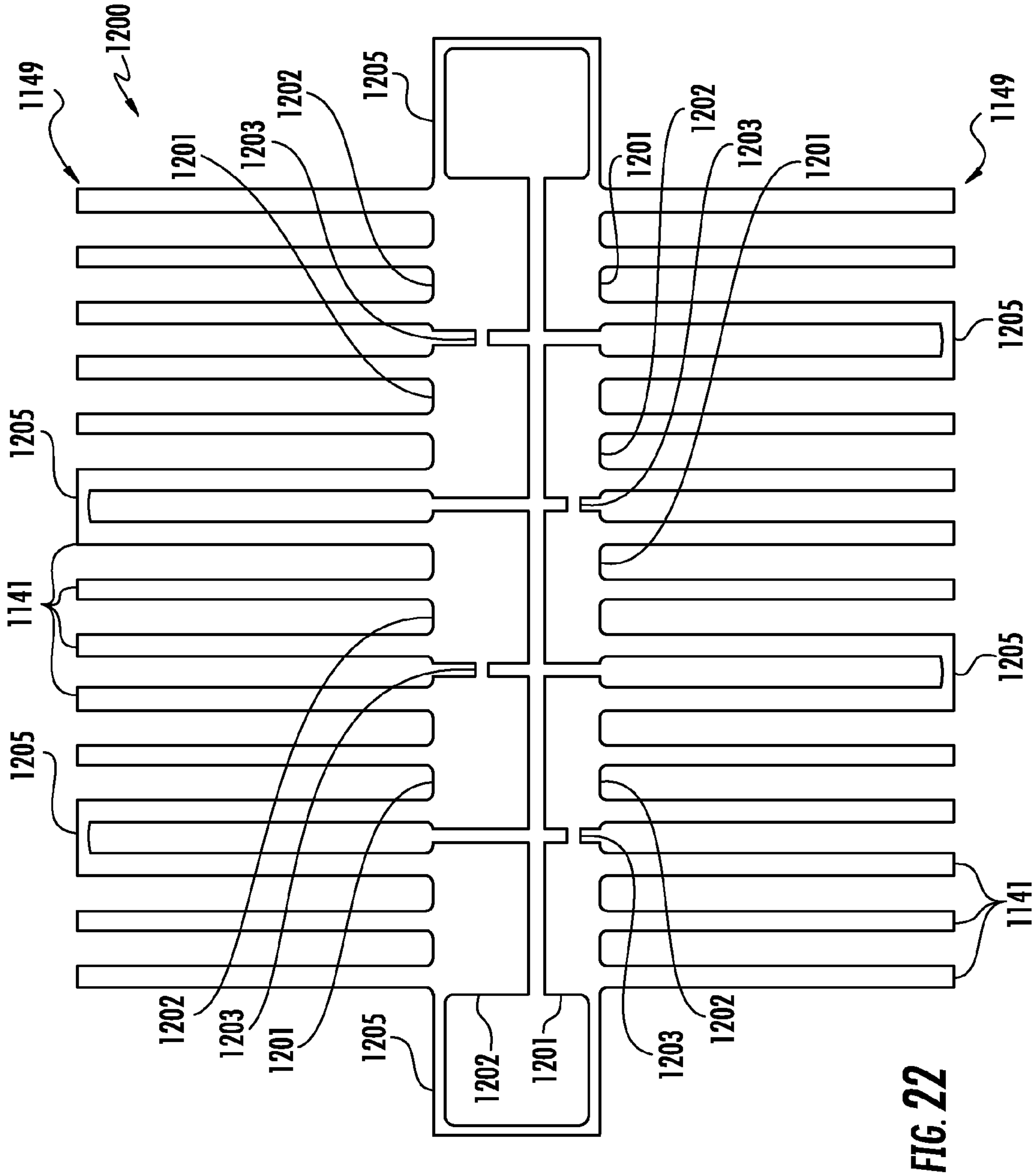
FIG. 22 is a plan view of a lead frame usable in embodiments of the LED assembly of the invention.
Figure 38:
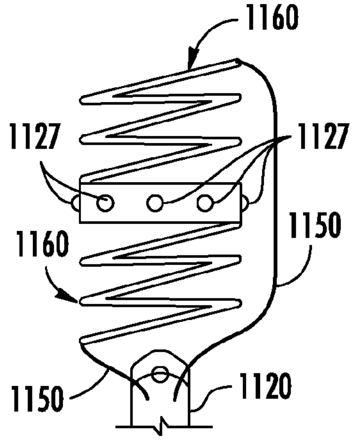
FIG. 38 is a schematic side view of still another embodiment of the LED assembly usable in the lamp of FIG. 10.
Figure 39:
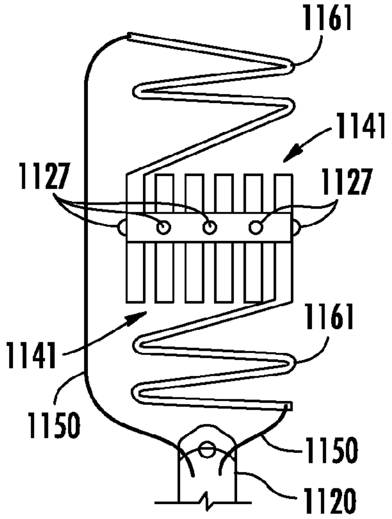
FIG. 39 is a schematic side view similar to FIG. 38 of still another embodiment of the LED assembly usable in the lamp of FIG. 10.
Figure 40:
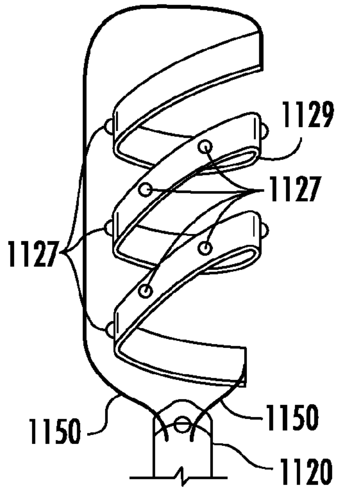
FIG. 40 is a schematic side view similar to FIG. 38 of yet another embodiment of the LED assembly usable in the lamp of FIG. 10.

Another technique for increasing the thermal resistance of the electrical path between the heat source during the fusing operation and the LEDs 1127 is to connect the wires to an electrically conductive element that is remote from LEDs 1127 as shown in FIGS. 21 and 38 through 40. In these embodiments the length of wires 1150 may be relatively short but the electrical connection with the LEDs 1127 is made though an electrically conductive portion of the LED assembly 1130. In such an embodiment the length of the thermal path between the LEDs and the heat source is increased to thereby increase its thermal resistance without increasing the length of the wires 1150. This technique may be used in combination with making the cross-sectional area of the wires thinner and/or increasing the length of the wires 1150. FIG. 21 shows an embodiment where a heat sink structure comprises a plurality of extending fins where the electrical connection between the wires 1150 and the LEDs 1127 is made through selected ones of the fins 1161. In the embodiment of FIG. 38 the heat sink structure 1160 comprises a zigzag or helical shape where the electrical connection between wires 1150 and the LEDs 1127 is made through the length of these components. In the embodiment of FIG. 39 a heat sink structure comprising fins 1141 is provided in addition to a zigzag or helical shape connector 1161 where the electrical connection between wires 1150 and the LEDs 1127 is made through the length of connectors 1161. Connectors 1161 may also function as a heat sink. In the embodiment of FIG. 40 the submount 1129 has a helical or serpentine path where the LEDs 1127 are mounted along the length of the submount. The wires 1150 are connected to the submount 1129 at positions remote from the LEDs 1127 such that the thermal resistance of the path between the point of application and the LEDs is raised to acceptable limits. In all of these embodiments the wires 1150 may be provided with additional length to further increase the thermal resistance of the electrical connection.

Figure 16:
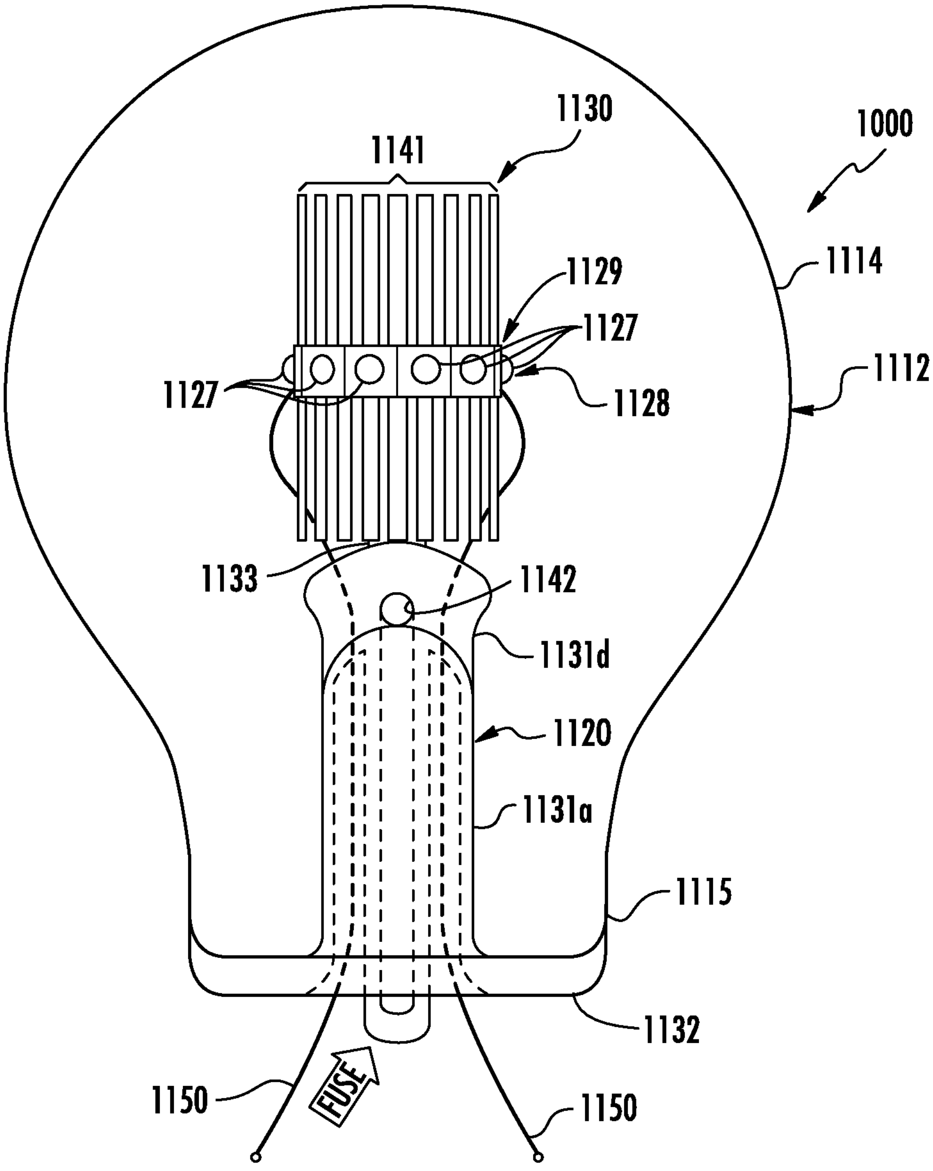
FIG. 16 is a side view of an embodiment of a stem and LED assembly fused to the enclosure of FIG. 11 showing the manufacture of the embodiment of FIG. 10.

Referring to FIG. 15, after the flange 1132 of stem part 1131 is fused to the enclosure 1112, gas such as helium, hydrogen or a non-explosive mixture of helium and hydrogen, or other thermal gas may be introduced into the enclosure through the passage 1126 and holes 1142. Typically, the enclosure 1112 is evacuated using nitrogen before the thermal gas is introduced. The gas may be introduced at pressures as previously described. After filling the enclosure with the thermal gas, the stem part portion 1131*b* is fused to close passage 1126 and seal the gas in the enclosure 1112 as shown in FIG. 16. The fusing of the stem removes the excess length of the stem part 1131 (portion 1131*b*) such that the neck 1115 may be secured to base 1102. The sealed enclosure 1112 is then attached to the base 1102 with the wires 1150 being connected to the electric path.

The steps described herein may be performed in an automated assembly line having rotary tables or other conveyances for moving the components between assembly stations.

While specific reference has been made with respect to an A-series lamp with an Edison base 1102 the structure and assembly method may be used on other lamps such as a PAR-style lamp such as a replacement for a PAR-38 incandescent bulb or a BR-style lamp. Moreover, while the use of a thermally conductive gas in the enclosure has been found to adequately manage heat, additional heat sinks may be provided if desired. For example heat conductive elements may be formed in or adjacent to the glass stem 1120 to conduct heat from the LEDs 1127 to the base 1102 where the heat may be dissipated by the base or an associated heat sink.

An embodiment of the LED assembly 1130 will be described with reference to FIGS. 22 through 30. In some embodiments, the submount 1129 of the LED assembly 1130 comprises a lead frame 1200 made of an electrically conductive material such as copper, copper alloy, aluminum, steel, gold, silver, alloys of such metals, thermally conductive plastic or the like. In one embodiment, the exposed surfaces of lead frame 1200 may be coated with silver or other reflective material to reflect light inside of enclosure 1112 during operation of the lamp. The lead frame 1200 comprises a series of anodes 1201 and cathodes 1202 arranged in pairs for connection to the LEDs 1127. In the illustrated embodiment five pairs of anodes and cathodes are shown for an LED assembly having five LEDs 1127; however, a greater or fewer number of anode/cathode pairs and LEDs may be used. Moreover, more than one lead frame may be used to make a single LED assembly 1130. For example, two of the illustrated lead frames may be used to make an LED assembly 1130 having ten LEDs.

Connectors 1203 connect the anode 1201 from one pair to the cathode 1202 of the adjacent pair to provide the electrical path between the pairs during operation of the LED assembly 1130. Typically, tie bars 1205 are also provided in the lead frame 1200 to hold the first portion of the lead frame to the second portion of the lead frame and to maintain the structural integrity of the lead frame during manufacture of the LED assembly. The tie bars 1205 are cut from the finished LED assembly and perform no function during operation of the LED assembly 1130. The lead frame 1200 also comprises a heat sink structure 1149 such as fins 1141 that are connected to the anodes 1201 and cathodes 1202 to conduct heat away from the LEDs and transfer the heat to the thermal gas in enclosure 1112 where the heat may be dissipated from the lamp. While a specific embodiment of fins 1141 is shown, the heat sink structure 1149 may have a variety of shapes, sizes and configurations. The lead frame 1200 may be formed by a stamping process and a plurality of lead frames may be formed in a single strip or sheet or the lead frames may be formed independently. In one method, the lead frame 1200 is formed as a flat member and is bent into a suitable three-dimensional shape such as a cylinder, sphere, polyhedra or the like to form LED assembly 1130. Because the lead frame 1200 is made of thin bendable material, and the anodes 1201 and cathodes 1202 may be positioned on the lead frame 1200 in a wide variety of locations, and the number of LEDs may vary, the lead frame 1200 may be configured such that it may be bent into a wide variety of shapes and configurations.

Figure 23:
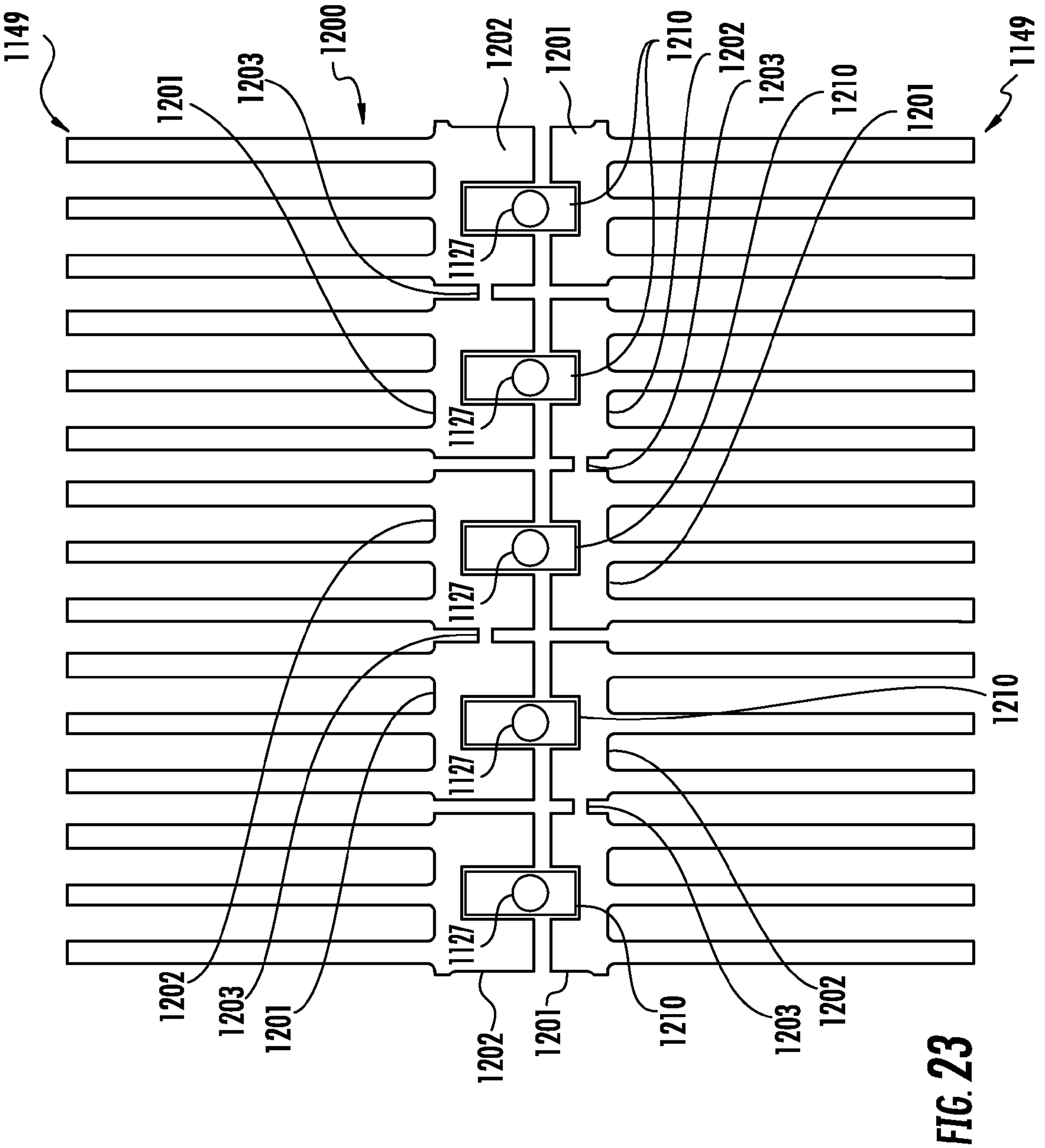
FIG. 23 is a plan view of a lead frame and LED packages usable in embodiments of the LED assembly of the invention.

Referring to FIG. 23, an LED package 1210 containing at least one LED 1127 is secured to each anode and cathode pair where the LED package 1210 spans the anode 1201 and cathode 1202. The LED packages 1210 may be attached to the lead frame 1200 by soldering. Once the LED packages 1210 are attached, the tie bars 1205 may be removed because the LED packages 1210 hold the first portion of the lead frame to the second portion of the lead frame.

Figure 24:
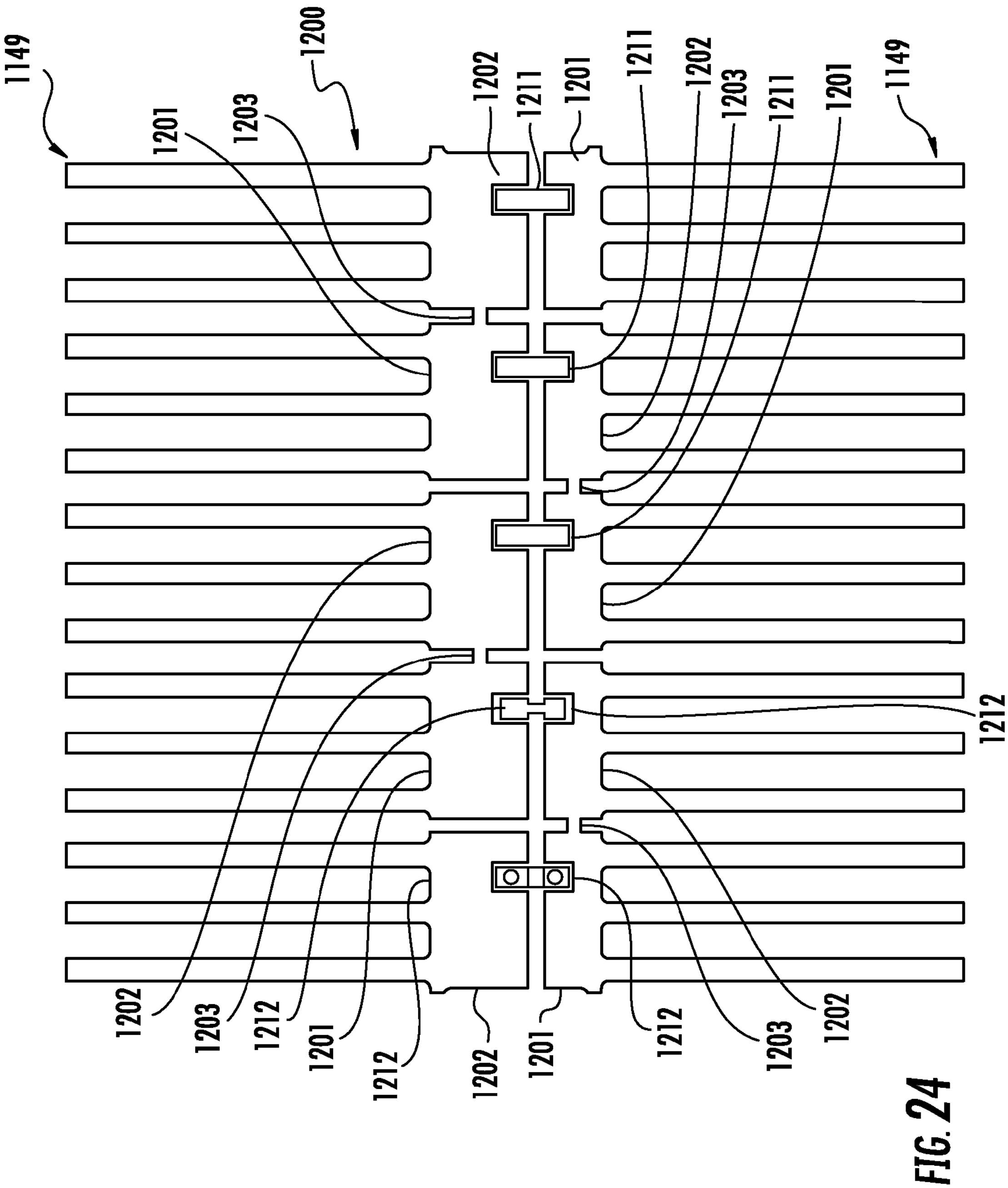
FIG. 24 is a plan view of an alternate embodiment of the lead frame usable in embodiments of the LED assembly of the invention.
Figure 25:
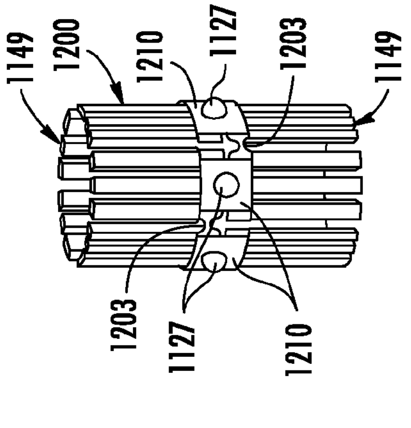
FIG. 25 is a perspective view of a lead frame configuration usable in embodiments of the LED assembly of the invention.

In some embodiments, the LED packages 1210 may not hold the lead frame 1200 together with sufficient structural integrity. In some embodiments separate supports 1211 may be provided to hold the lead frame 1200 together as shown in FIG. 24. The supports 1211 may comprise non-conductive material attached between the anode and cathode pairs to secure the lead frame together. The supports 1211 may comprise insert molded or injection molded plastic members that tie the anodes 1201 and cathodes 1202 together. The lead frame 1200 may be provided with areas 1212 that receive the supports 1211 to provide holds that may be engaged by the supports. For example, the areas 1212 may comprise notches or through holes that receive the plastic flow during a molding operation. The supports 1211 may also be molded or otherwise formed separately from the lead frame 1200 and attached to the lead frame in a separate assembly operation such as by using a snap-fit connection, adhesive, fasteners, a friction fit, a mechanical connection or the like. The LED packages 1210 may be secured to the lead frame 1200 before or after the supports 1211 are attached. While in the illustrated embodiments the supports 1211 are connected between the anodes 1201 and cathodes 1202 the supports 1211 may connect between other components such as portions of the heat sink structure 1149. The supports 1211 may be made of polyphthalamide white reflective plastic such as AMODEL® manufactured by Solvay Plastics. The material of the supports 1211 may preferably have the same coefficient of thermal expansion as the LED substrate of LED packages 1210 such that the LED packages and supports 1211 expand and contract at the same rate to prevent stresses from being created between the components. This may be accomplished using a liquid crystal polymer to make the supports 1211 with the desired engineered parameters The lead frame 1200 may be bent or folded such that the LEDs 1127 provide the desired light pattern in lamp 1000. In one embodiment the lead frame 1200 is bent into a cylindrical shape as shown in FIG. 25. The LEDs 1127 are disposed about the axis of the cylinder such that light is projected outward. The lead frame of FIG. 24 may be bent at connectors 1203 to form the three dimensional LED assembly shown in FIG. 25. The LEDs 1127 are arranged around the perimeter of the cylinder to project light radially.

Figure 26:
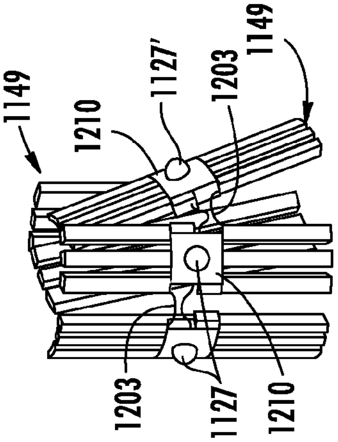
FIG. 26 is a perspective view of another lead frame configuration usable in embodiments of the LED assembly of the invention.
Figure 27:
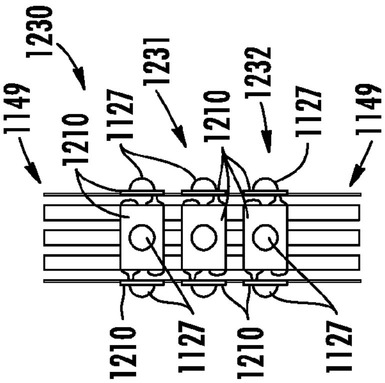
FIG. 27 is a side view of yet another lead frame configuration usable in embodiments of the LED assembly of the invention.
Figure 28:
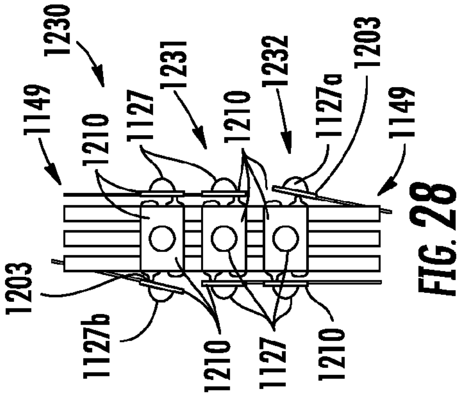
FIG. 28 is a side view of still another lead frame configuration usable in embodiments of the LED assembly of the invention.
Figure 29:
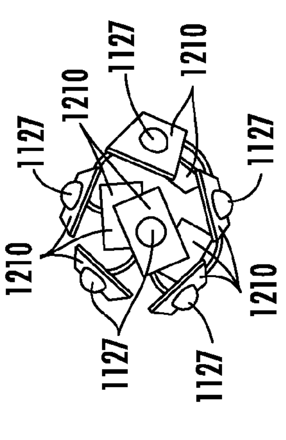
FIG. 29 is a perspective view of another lead frame configuration usable in embodiments of the LED assembly of the invention.
Figure 30:
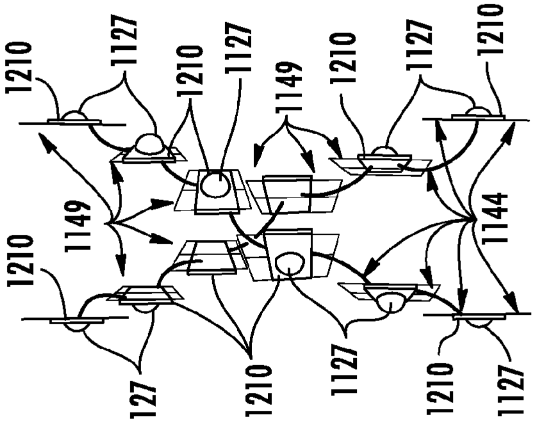
FIG. 30 is a side view of yet another lead frame configuration usable in embodiments of the LED assembly of the invention.
Figure 41:
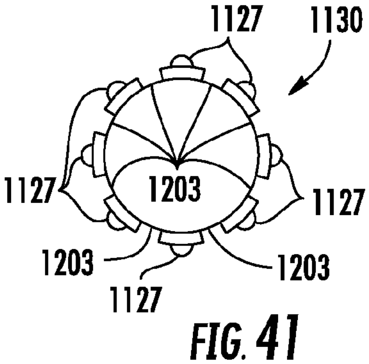
FIGS. 41 through 43 are end views of various embodiments of the LED assembly showing illustrative shapes.
Figure 42:
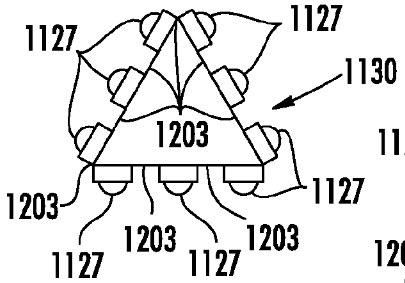
Figure 43:
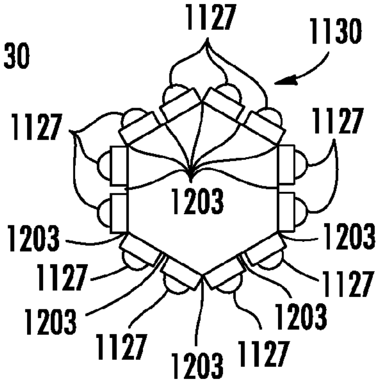

Because the lead frame 1200 is pliable and the LED placement on the lead frame may be varied, the lead frame may be formed and bent into a variety of configurations. FIG. 26 shows the lead frame 1200 such as used to make the LED assembly of FIG. 25 bent such that one of the LEDs (not shown) is angled toward the bottom of the LED assembly and another of the LEDs 1127' is angled toward the top of the LED assembly 1130 with the remaining LEDs projecting light radially from the cylindrical LED assembly. LEDs typically project light over less than 180 degrees such that tilting selected ones of the LEDs ensures that a portion of the light is projected toward the bottom and top of the lamp. Some LEDs project light through an angle of 120 degrees. By angling selected ones of the LEDs approximately 30 degrees relative to the axis of the LED assembly 1130 the light projected from the cylindrical array will project light over 360 degrees. The angles of the LEDs and the number of LEDs may be varied to create a desired light pattern. For example, FIG. 27 shows an embodiment of a three tiered LED assembly where each tier 1230, 1231 and 1232 comprises a series of a plurality of LEDs 1127 arranged around the perimeter of the cylinder. FIG. 28 shows an embodiment of a three tiered LED assembly where each tier 1230, 1231 and 1232 comprises a series of a plurality of LEDs 1127 arranged around the perimeter of the cylinder. Selected ones of the LEDs 1127*a*, 1127*b* are angled with respect to the LED array to project a portion of the light along the axis of the cylindrical LED assembly toward the top and bottom of the LED assembly. FIG. 29 shows an embodiment of an LED assembly shaped into a polyhedron with the heat sink structure removed for clarity. FIG. 30 shows an embodiment of the LED array arranged as a double helix with two series of LED packages each arranged in series to form a helix shape. In the embodiments of FIGS. 25 through 28 the lead frame is formed to have a generally cylindrical shape; however, the lead frame may be bent into a variety of shapes. FIG. 41 shows an end view of an LED assembly 1130 bent to have a generally cylindrical shape similar to that of FIG. 25. FIG. 42 shows an end view of a LED assembly 1130 bent to have a generally triangular shape and FIG. 43 shows an end view of a LED assembly 1130 bent to have a generally hexagonal shape. The LED assembly 1130 may have any suitable shape and the lead frame 1300 may be bent into any suitable shape including any polygonal shape or even more complex shapes such as shown in FIG. 29.

Another alternate embodiment of LED assembly 1130 is shown in FIGS. 31 through 36. In this embodiment the submount comprises a metal core board 1300 such as a metal core printed circuit board (MCPCB). The metal core board comprises a thermally and electrically conductive core 1301 made of aluminum or other similar pliable metal material. The core 1301 is covered by a dielectric material 1302 such as polyimide. Metal core boards allow traces to be formed therein. In one method, the core board 1300 is formed as a flat member and is bent into a suitable shape such as a cylinder, sphere, polyhedra or the like. Because the core board 1300 is made of thin bendable material and the anodes, and cathodes may be positioned in a wide variety of locations, and the number of LED packages may vary, the lead frame may be configured such that it may be bent into a wide variety of shapes and configurations.

Figure 33:
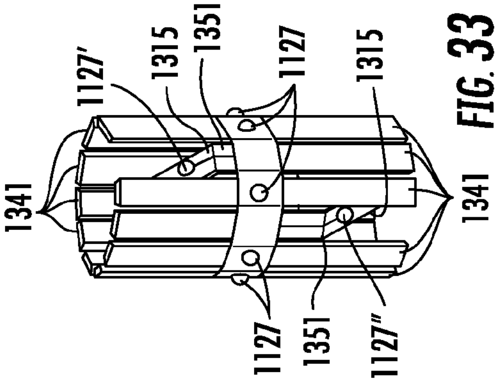
FIG. 33 is a perspective view of another core board configuration usable in embodiments of the LED assembly of the invention.
Figure 32:
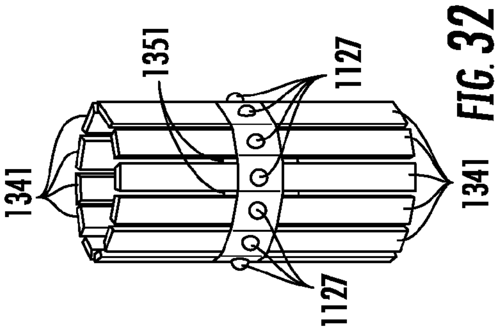
FIG. 32 is a perspective view of a core board configuration usable in embodiments of the LED assembly of the invention.
Figure 31:
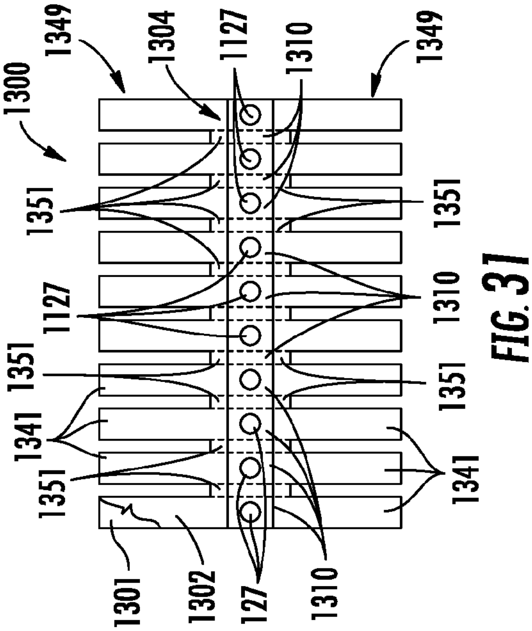
FIG. 31 is a plan view of a core board configuration usable in embodiments of the LED assembly of the invention.
Figure 36:
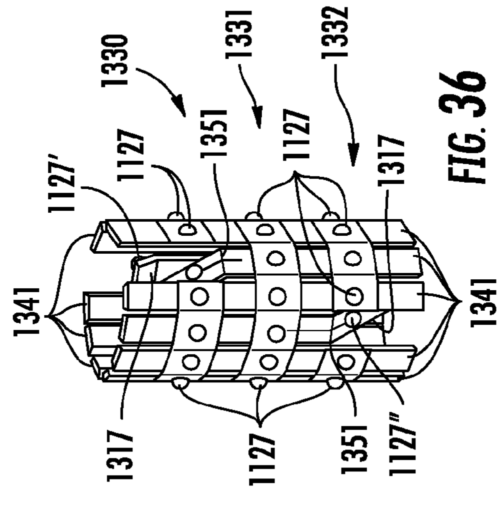
FIG. 36 is a perspective view of yet another core board configuration usable in embodiments of the LED assembly of the invention.
Figure 35:
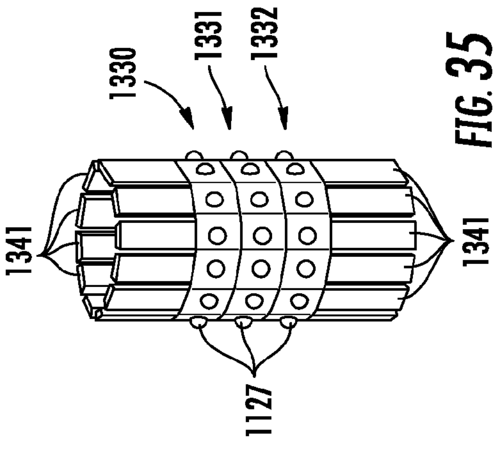
FIG. 35 is a perspective view of still another core board configuration usable in embodiments of the LED assembly of the invention.
Figure 34:
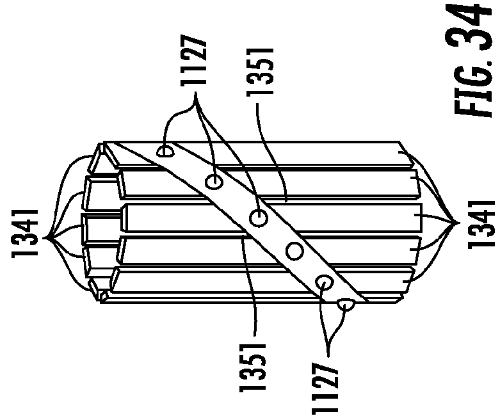
FIG. 34 is a perspective view of yet another core board configuration usable in embodiments of the LED assembly of the invention.

In one embodiment the core board 1300 is formed as a flat member having a central band 1304 on which the LED packages 1310 containing LEDs 1127 are mounted as shown in FIG. 31. A heat sink structure 1349 such as a plurality of fins 1341 or other heat dissipating elements extend from the central band. The central band 1304 is divided into sections by thinned areas or score lines 1351. The LED packages 1310 are located on the sections such that the core board 1300 may be bent along the score lines 1351 to form the planar core board into a variety of three-dimensional shapes where the shape is selected to project a desired light pattern from the lamp 1000. In the illustrated embodiment, a fin extends from each side of the sections such that the sections may be bent relative to one another along the score lines 1351 to create a cylindrical LED assembly as shown in FIG. 32. Moreover, the LEDs or selected ones of the LEDS 1127', 1127" may be located on portions 1315 of the metal core board 1300 that are bent such that the light is projected more axially as shown in FIG. 33. The LEDs 1127 may be placed on the core board 1300 to form a helix or other pattern as shown in FIG. 34. FIG. 35 shows an embodiment of a three tiered LED assembly where each tier 1330, 1331 and 1332 comprises a series of LEDs 1127. FIG. 36 shows a three tiered system where selected ones of the LEDs 1127', 1127" are mounted on sections 1317 of the core board 1317 that are angled with respect to the LED array to project a portion of the light along the axis of the LED assembly. In the embodiments of FIGS. 32 through 36 the core board 1300 is formed to have a generally cylindrical shape; however, the core board may be bent into a variety of shapes. FIG. 41 shows an end view of an LED assembly 1130 bent to have a generally cylindrical shape similar to that of FIG. 32. FIG. 42 shows an end view of a LED assembly 1130 bent to have a generally triangular shape and FIG. 43 shows an end view of a LED assembly 1130 bent to have a generally hexagonal shape. The LED assembly 1130 may have any suitable shape and the core board 1300 may be bent into any suitable shape including any polygonal shape or even more complex shapes.

Figure 44:
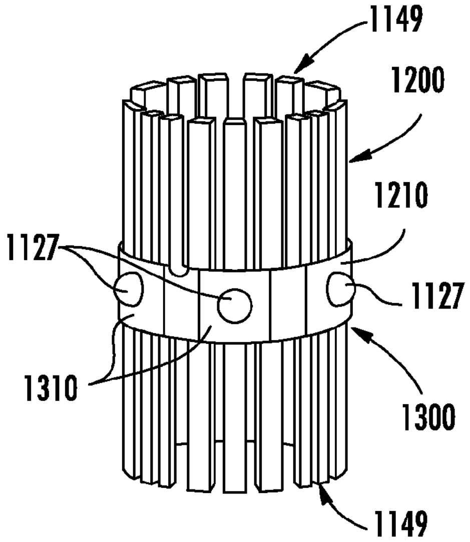
FIG. 44 is a perspective view of a metal core board/lead frame configuration usable in embodiments of the LED assembly of the invention.
Figure 45:
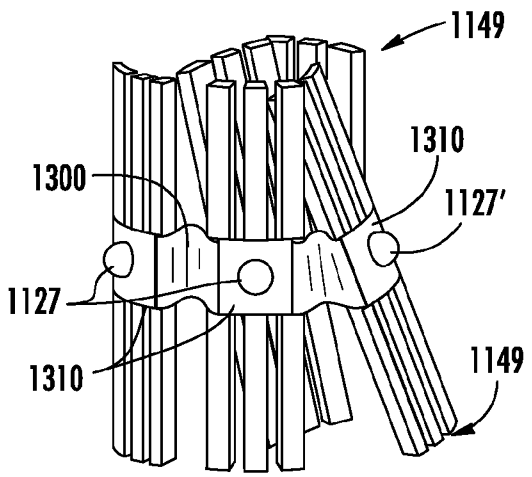
FIG. 45 is a perspective view of another metal core board/lead frame configuration usable in embodiments of the LED assembly of the invention.
Figure 46:
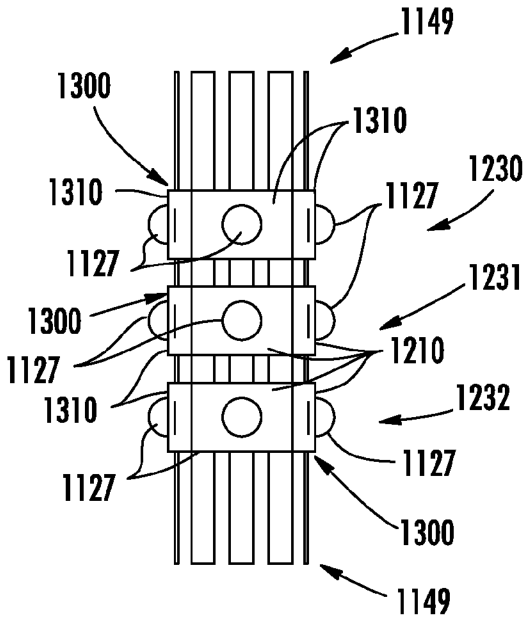
FIG. 46 is a side view of yet another metal core board/lead frame configuration usable in embodiments of the LED assembly of the invention.
Figure 47:
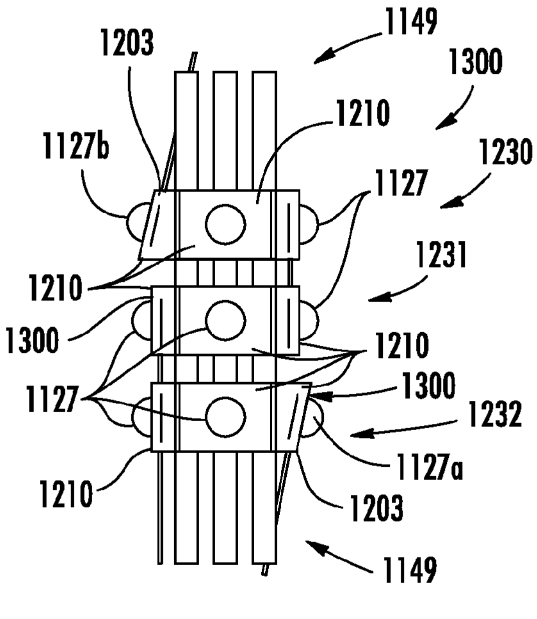
FIG. 47 is a side view of still another metal core board/lead frame configuration usable in embodiments of the LED assembly of the invention.

Referring to FIGS. 44 through 47 alternate embodiments of the LED assembly is shown. In some embodiments, the LED assembly 1130 comprises a hybrid of a metal core board 1300 on which the LED packages 1310 containing LEDs 1127 are mounted where the metal core board 1300 may be thermally and/or electrically coupled to a lead frame structure 1200. The lead frame 1200 forms the heat sink structure or spreaders 1149 that are attached to the back side of the metal core printed circuit board 1300. Both the lead frame 1200 and the metal core board 1300 may be bent into the various configurations discussed herein. The metal core board 1300 may be provided with score lines or reduced thickness areas 1351 as previously described with reference to FIG. 31 to facilitate the bending of the core board. In one example embodiment, FIG. 44 shows the LED assembly bent into a generally cylindrical shape. In another example embodiment, FIG. 45 shows the LED assembly bent into a generally cylindrical shape where at least some of the LEDs 1127' are mounted so as to project light along the axis of the cylinder. In another example embodiment, FIG. 46 shows the LED assembly bent into a generally cylindrical shape where three tiers 1230, 1231 and 1232 of core boards 1300 and LEDs 1127 are used. In another example embodiment, FIG. 47 shows the LED assembly bent into a generally cylindrical shape where three tiers 1230, 1231 and 1232 of core boards 1300 and LEDs 1127 are used and at least some of the LEDs 1127*a* and 1127*b* are mounted so as to project light along the axis of the cylinder. In addition to this hybrid version, the LED assembly may also comprise a PCB made with FR4 and thermal vias rather than the metal core board where the thermal vias are then connected to lead frame based heat spreaders. In such embodiments arrangement the LED assembly may be formed as shown in FIGS. 44 through 47.

Figure 37:
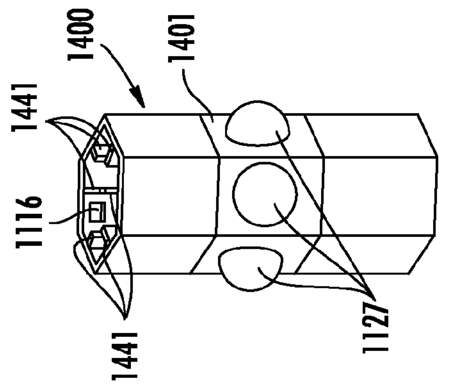
FIG. 37 is a perspective view of an extruded submount usable in embodiments of the LED assembly of the invention.

Another embodiment of LED assembly 1130 is shown in FIG. 37. LED assembly 1130 comprises an extruded submount 1400 which may be formed of aluminum or copper or other similar material. A flex circuit or board 1401 is mounted on the extruded submount that supports LEDs 1127. A plurality of heat sinks such as fins 1441 are extruded with the submount 1400 and may be located inside of the submount. The extruded submount may comprise a variety of shapes such as illustrated in FIGS. 41 through 43 and the heat sinks such as fins 1441 may have any suitable shape and may be located on the outside surface of the submount. A gas movement device 1116 may be located in the interior of the submount 1400 to move the gas over the fins 1300.

The LED assembly, whether made of a lead frame submount, metal core board submount, or a hybrid combination of metal core board/lead frame or a PCB made with FR4/lead frame may be formed to have any of the configurations shown herein or other suitable three-dimensional geometric shape. The LED assembly may be advantageously bent into any suitable three-dimensional shape.

As previously mentioned, at least some embodiments of the invention make use of a submount on which LED devices are mounted. In some embodiments, power supply or other LED driver components can also be mounted on the submount. A submount in example embodiments is a solid structure, which can be transparent, semi-transparent, diffusively transparent or translucent. A submount with any of these optical properties or any similar optical property can be referred to herein as optically transmissive. Such a submount may be a paddle shaped form, with two sides for mounting LEDs. If the submount is optically transmissive, light from each LED can shine in all directions, since it can pass through the submount. A submount for use with embodiments of the invention may have multiple mounting surfaces created by using multiple paddle or alternatively shaped portions together. Notwithstanding the number of portions or mounting surfaces for LEDs, the entire assembly for mounting the LEDs may be referred to herein as a submount. An optically transmissive submount may be made from a ceramic material, such as alumina, or may be made from some other optically transmissive material such as sapphire. Many other materials may be used.

An LED array and submount as described herein can be used in solid-state lamps making use of thermic constituents other than a gas. A thermic constituent is any substance, material, structure or combination thereof that serves to cool an LED, an LED array, a power supply or any combination of these in a solid-state lamp. For example, an optically transmissive substrate with LEDs as described herein could be cooled by a traditional heatsink made of various materials, or such an arrangement could be liquid cooled. As examples, a liquid used in some embodiments of the invention can be oil. The oil can be petroleum-based, such as mineral oil, or can be organic in nature, such as vegetable oil. The liquid may also be a perfluorinated polyether (PFPE) liquid, or other fluorinated or halogenated liquid. An appropriate propylene carbonate liquid having at least some of the above-discussed properties might also be used. Suitable PFPE-based liquids are commercially available, for example, from Solvay Solexis S.p.A of Italy. Flourinert™ manufactured by the 3M Company in St. Paul, Minn., U.S.A. can be used as coolant.

As previously mentioned, the submount in a lamp according to embodiments of the invention can optionally include the power supply or driver or some components for the power supply or driver for the LED array. In some embodiments, the LEDs can actually be powered by AC. Various methods and techniques can be used to increase the capacity and decrease the size of a power supply in order to allow the power supply for an LED lamp to be manufactured more cost-effectively, and/or to take up less space in order to be able to be built on a submount. For example, multiple LED chips used together can be configured to be powered with a relatively high voltage. Additionally, energy storage methods can be used in the driver design. For example, current from a current source can be coupled in series with the LEDs, a current control circuit and a capacitor to provide energy storage. A voltage control circuit can also be used. A current source circuit can be used together with a current limiter circuit configured to limit a current through the LEDs to less than the current produced by the current source circuit. In the latter case, the power supply can also include a rectifier circuit having an input coupled to an input of the current source circuit.

Some embodiments of the invention can include a multiple LED sets coupled in series. The power supply in such an embodiment can include a plurality of current diversion circuits, respective ones of which are coupled to respective nodes of the LED sets and configured to operate responsive to bias state transitions of respective ones of the LED sets. In some embodiments, a first one of the current diversion circuits is configured to conduct current via a first one of the LED sets and is configured to be turned off responsive to current through a second one of the LED sets. The first one of the current diversion circuits may be configured to conduct current responsive to a forward biasing of the first one of the LED sets and the second one of the current diversion circuit may be configured to conduct current responsive to a forward biasing of the second one of the LED sets.

In some of the embodiments described immediately above, the first one of the current diversion circuits is configured to turn off in response to a voltage at a node. For example a resistor may be coupled in series with the sets and the first one of the current diversion circuits may be configured to turn off in response to a voltage at a terminal of the resistor. In some embodiments, for example, the first one of the current diversion circuits may include a bipolar transistor providing a controllable current path between a node and a terminal of a power supply, and current through the resistor may vary an emitter bias of the bipolar transistor. In some such embodiments, each of the current diversion circuits may include a transistor providing a controllable current path between a node of the sets and a terminal of a power supply and a turn-off circuit coupled to a node and to a control terminal of the transistor and configured to control the current path responsive to a control input. A current through one of the LED sets may provide the control input. The transistor may include a bipolar transistor and the turn-off circuit may be configured to vary a base current of the bipolar transistor responsive to the control input.

It cannot be overemphasized that with respect to the features described above with various example embodiments of a lamp, the features can be combined in various ways. For example, the various methods of including phosphor in the lamp can be combined and any of those methods can be combined with the use of various types of LED arrangements such as bare die vs. encapsulated or packaged LED devices. The embodiments shown herein are examples only, shown and described to be illustrative of various design options for a lamp with an LED array.

LEDs and/or LED packages used with an embodiment of the invention and can include light emitting diode chips that emit hues of light that, when mixed, are perceived in combination as white light. Phosphors can be used as described to add yet other colors of light by wavelength conversion. For example, blue or violet LEDs can be used in the LED assembly of the lamp and the appropriate phosphor can be in any of the ways mentioned above. LED devices can be used with phosphorized coatings packaged locally with the LEDs or with a phosphor coating the LED die as previously described. For example, blue-shifted yellow (BSY) LED devices, which typically include a local phosphor, can be used with a red phosphor on or in the optically transmissive enclosure or inner envelope to create substantially white light, or combined with red emitting LED devices in the array to create substantially white light. Such embodiments can produce light with a CRI of at least 70, at least 80, at least 90, or at least 95. By use of the term substantially white light, one could be referring to a chromacity diagram including a blackbody locus of points, where the point for the source falls within four, six or ten MacAdam ellipses of any point in the blackbody locus of points.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

Figure 4:
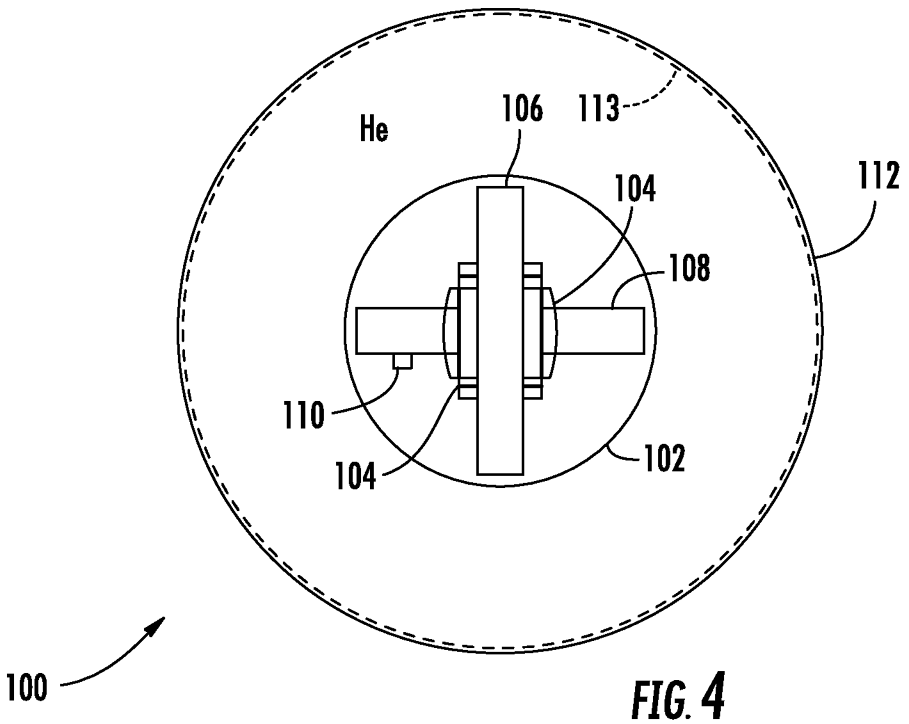
FIG. 4 is a top down view of the LED lamp of FIG. 1. Again, the optical enclosure of the lamp is shown as cross-sectioned so that the inter detail may be appreciated.
Figure 5:
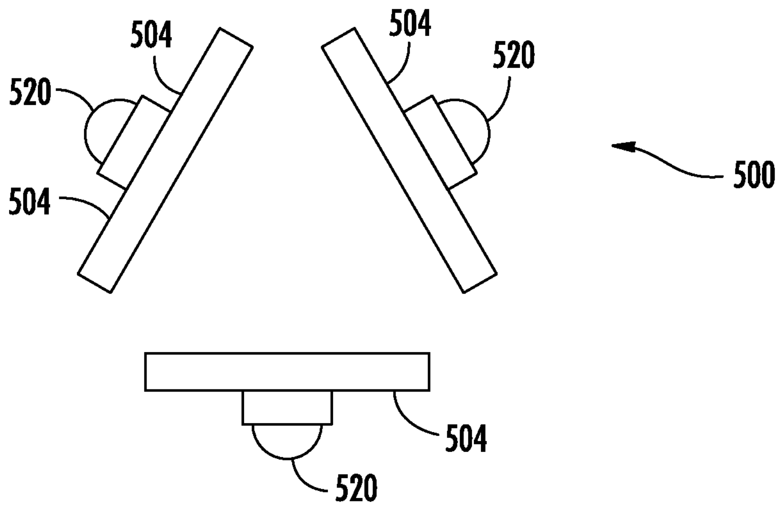
FIG. 5 is a top down view of a submount for an LED lamp according to additional embodiments of the invention.

FIGS. 4 and 5 are top views illustrating, comparing and contrasting two example submounts that can be used with embodiments of the invention. FIG. 4 is a top view of the LED lamp 100 of FIG. 1. LEDs 104, which are die encapsulated along with a phosphor to provide local wavelength conversion, are visible in this view, while other LEDs are obscured. The light transmissive submount portions 106 and 108 are also visible. Power supply or other driver components 110 are schematically shown on the bottom portion of the submount. As previously mentioned, enclosure 112 is, in some embodiments, a glass enclosure of similar shape to that commonly used in household incandescent bulbs. The glass enclosure is coated on the inside with silica 113 to provide diffusion, uniformity of the light pattern, and a more traditional appearance to the lamp. The enclosure is shown cross-sectioned so that the submount is visible, and the inside of the base of the lamp 102 is also visible in this top view.

FIG. 5 is a top view of another submount and LED array that can be used in a lamp according to example embodiments of the invention. Submount 500 has three identical portions 504 spaced evenly and symmetrically about a center point. Each has two LED devices, one of which is visible. LED devices 520 are individually encapsulated, each in a package with its own lens. In some embodiments, at least one of these devices is encapsulated with a phosphor by coating the lens of the LED package with a phosphor. With packaged LEDs like those shown, light is not normally emitted from the bottom of the package. Therefore there is less benefit in making the submount from optically transmissive material if packaged LEDs are used. Nevertheless, if the inside of the lamp or fixture includes reflective elements, it may still be desirable to use optically transmissive submounts to allow reflected light to pass through the submounts to produce a desired lighting pattern.

Figure 6A:
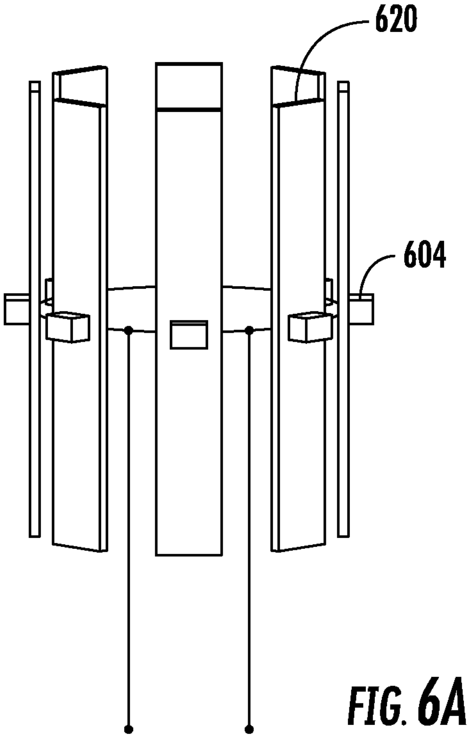
FIGS. 6A and 6B show an additional alternative for a submount for an LED lamp.
Figure 6B:
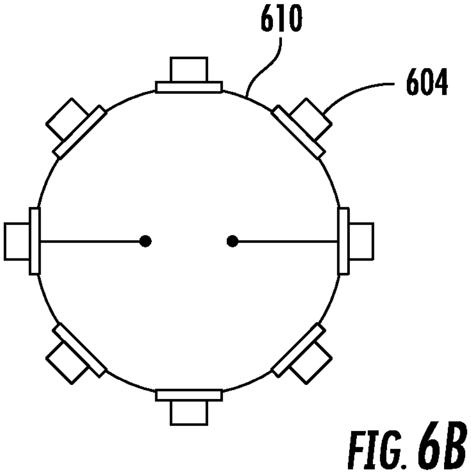

FIGS. 6A and 6B are a side view and a top view, respectively, illustrating an example submount that can be used with embodiments of the invention. LEDs 604 are dies which may be covered with a silicone or similar encapsulant (not shown) which may include a phosphor (not shown). The submount in this case is a wire frame structure 610 with "finger" portions 620 that provide additional coupling between the submount and gas within the optical enclosure or envelope of a lamp. In this and other examples where coupling mechanisms are used, the gas and the coupling mechanism together might be considered the thermic constituent for the lamp.

Figure 7A:
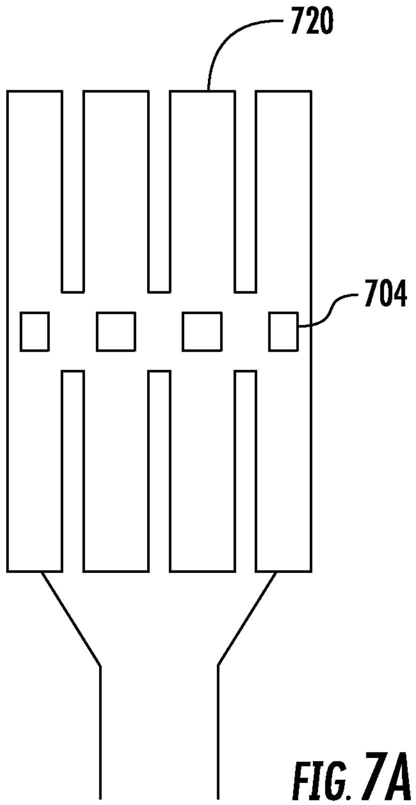
FIGS. 7A and 7B show a further alternative for a submount for an LED lamp.
Figure 7B:
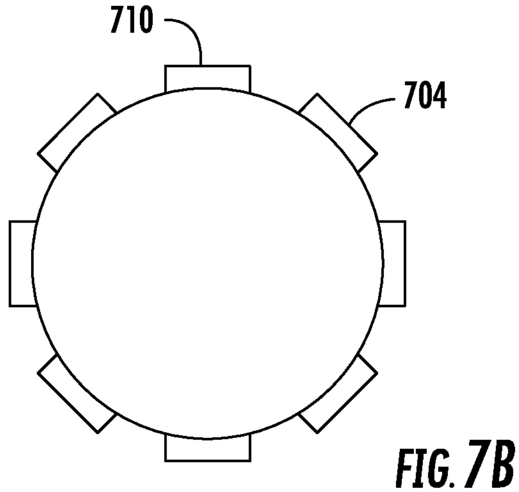

FIGS. 7A and 7B are a side view and a top view, respectively, illustrating another example submount that can be used with embodiments of the invention. LEDs 704 are dies which may be covered with a silicone or similar encapsulant (not shown) which may include a phosphor (not shown). The submount in this case is a printed circuit board structure 710 with "finger" portions 720 that provide additional coupling between the submount and gas within the optical enclosure or envelope of a lamp.

Figure 8:
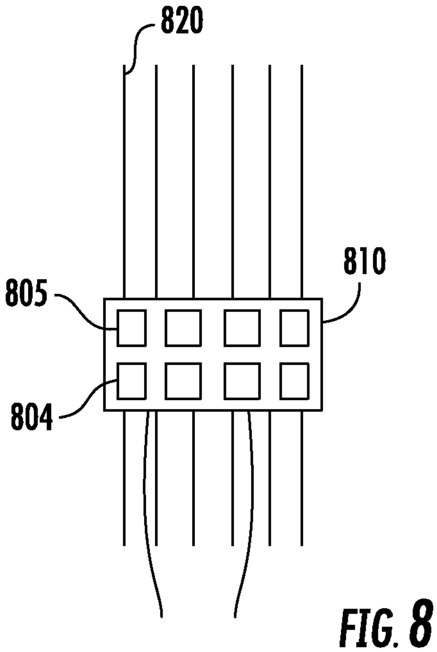
FIGS. 8 and 9 show further alternatives for submounts for and LED lamp according to example embodiments of the invention.

FIG. 8 is a side view, illustrating another example submount that can be used with embodiments of the invention. The LEDs in this case are arranged in two rows, which can optionally provide for combinations of different types of emitters. For example, LEDs 804 can which may be covered with a silicone or similar encapsulant (not shown) which may include a phosphor (not shown) to provide local wavelength conversion and LEDs 805 might have no such phosphor. The submount in this case is a printed circuit board structure 810 with metal fingers 820 attached to provide additional coupling between the submount and gas within the optical enclosure or envelope of a lamp.

Figure 9:
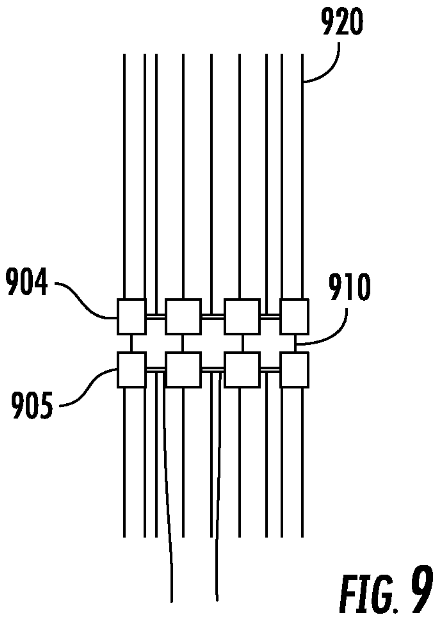
Figure 10:
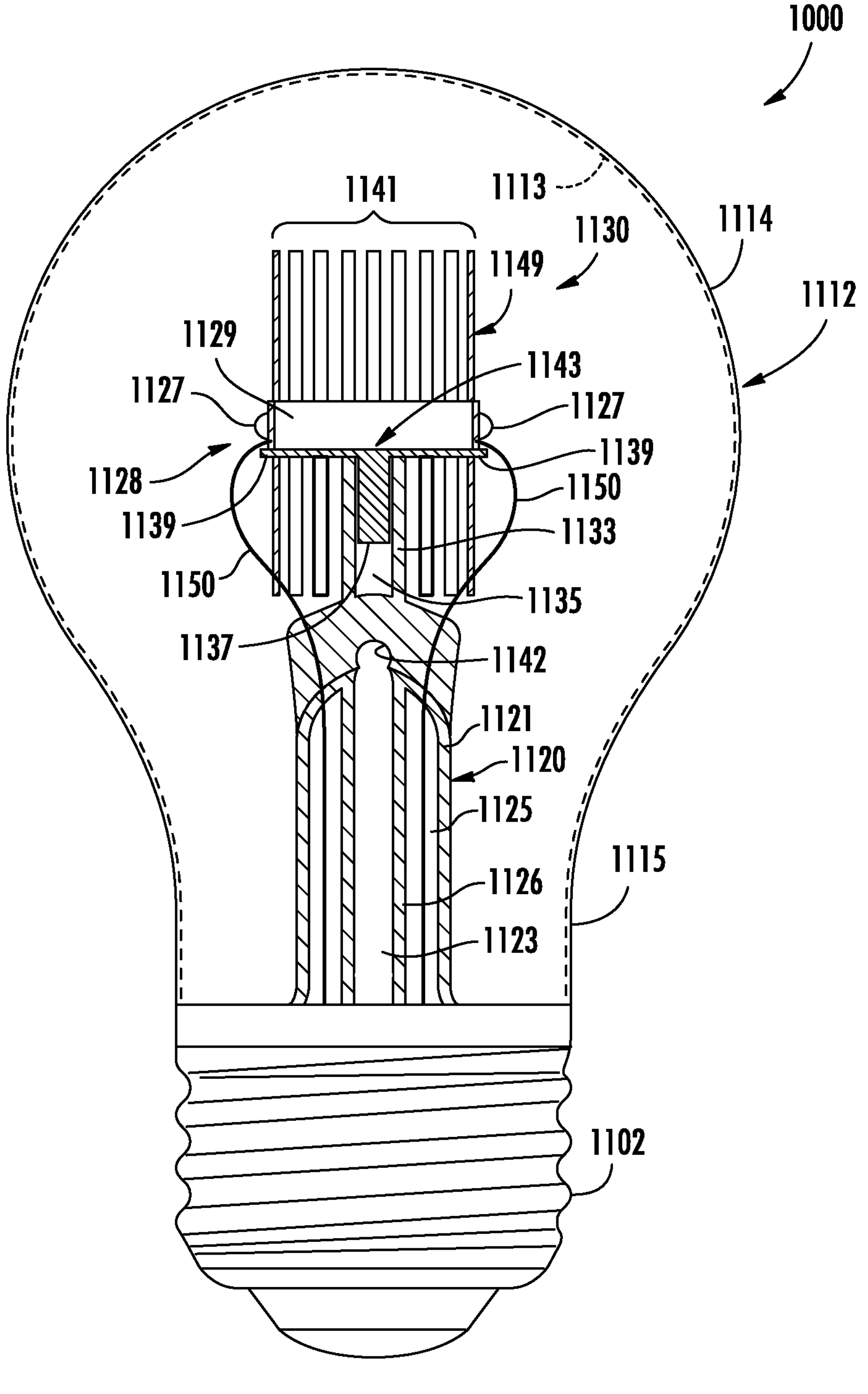
FIG. 10 is a partial section view of an LED lamp showing an alternate embodiment of the invention where the enclosure, LED assembly and stem are shown in cross-section.

FIG. 9 is a side view, illustrating another example submount that can be used with embodiments of the invention. The LEDs are again arranged in two rows, which can optionally provide for combinations of different types of emitters. For example, LEDs 904 can which may be covered with a silicone or similar encapsulant (not shown) which may include a phosphor (not shown) to provide local wavelength conversion and LEDs 905 might have no such phosphor. The submount in this case is a wire frame structure 910 with metal fingers 920 to provide coupling between the submount and gas within the optical enclosure or envelope of a lamp.

The various parts of an LED lamp according to example embodiments of the invention can be made of any of various materials. A lamp according to embodiments of the invention can be assembled using varied fastening methods and mechanisms for interconnecting the various parts. For example, in some embodiments locking tabs and holes can be used. In some embodiments, combinations of fasteners such as tabs, latches or other suitable fastening arrangements and combinations of fasteners can be used which would not require adhesives or screws. In other embodiments, adhesives, solder, brazing, screws, bolts, or other fasteners may be used to fasten together the various components.

Although specific embodiments have been illustrated and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A lamp comprising:

an optically transmissive enclosure containing a gas;

an LED assembly disposed in the optically transmissive enclosure to be operable to emit light when energized through an electrical connection, the LED assembly comprising a lead frame made of an electrically conductive material and comprising at least one anode and at least one cathode and at least one LED mounted on the at least one anode and the at least one cathode and, the lead frame further comprising a heat sink structure made of the electrically conductive material, the lead frame and heat sink structure being bent into a three-dimensional shape to create a desired light pattern in the enclosure such that the heat sink structure is thermally coupled to the gas in the enclosure and is entirely contained inside of the enclosure.

2. The lamp of claim 1 comprising a glass stem fused to the enclosure supporting the LED assembly.

3. The lamp of claim 1 wherein a portion of the lead frame is covered with a reflective material to reflect light inside of the enclosure.

4. The lamp of claim 1 wherein the LED assembly comprises two lead frames.

5. The lamp of claim 1 wherein the heat sink structure comprises a plurality of fins.

6. The lamp of claim 1 wherein the lead frame comprises a first portion and a second portion, and a non-conductive support securing the first portion to the second portion.

7. The lamp of claim 6 wherein the support comprises a molded plastic member.

8. The lamp of claim 1 comprising at least one electrically non-conductive support connected between the at least one anode and the at least one cathode.

9. The lamp of claim 1 wherein the lead frame supports a plurality of LEDs where the plurality of LEDs are formed into a cylindrical shape.

10. The lamp of claim 1 wherein the lead frame supports a plurality of LEDs where at least one of the LEDs is angled toward a top of the LED assembly.

11. The lamp of claim 1 wherein the lead frame comprises a plurality of LEDs arranged in a first tier and a second plurality of LEDs arranged in a second tier.

12. The lamp of claim 1 wherein the lead frame supports a plurality of LEDs where the plurality of LEDs are formed into a polyhedron.

13. The lamp of claim 1 wherein the lead frame supports a plurality of LEDs where the plurality of LEDs are formed into a helix.

14. A lamp comprising:

an optically transmissive enclosure;

an LED assembly disposed in the optically transmissive enclosure to be operable to emit light when energized through an electrical connection, the LED assembly comprising a metal core board comprising at least one anode and at least one cathode and at least one LED mounted on the at least one anode and the at least one cathode and a heat sink structure, the metal core board being bent into a three-dimensional shape to create a desired light pattern in the enclosure.

15. The lamp of claim 14 comprising a gas contained in the enclosure to provide thermal coupling to the LED assembly.

16. The lamp of claim 14 comprising a glass stem fused to the enclosure supporting the LED assembly.

17. The lamp of claim 14 wherein the metal core board comprises a thermally and electrically conductive core made of a pliable metal material.

18. The lamp of claim 17 wherein the core is covered by a dielectric material.

19. The lamp of claim 14 wherein the metal core board is formed as a flat member having a central band on which a plurality of LED packages containing LEDs are mounted and a heat sink structure extending from the central band.

20. The lamp of claim 19 wherein the central band is divided into sections by thinned areas and the LEDs are located on the sections such that the metal core board may be bent along the thinned areas.

21. The lamp of claim 14 wherein the heat sink structure comprises fins.

22. The lamp of claim 14 wherein the metal core board is bent into a cylindrical shape.

23. The lamp of claim 14 wherein the LEDs are placed on the metal core board to form a helix.

24. The lamp of claim 14 wherein a first plurality of LEDs are arranged in a first tier and a second plurality of LEDs arranged in a second tier.

25. The lamp of claim 14 wherein at least one of the plurality of LEDs is angled toward a top of the LED assembly.

26. A lamp comprising:

an optically transmissive enclosure;

an LED assembly disposed in the optically transmissive enclosure to be operable to emit light when energized through an electrical connection, the LED assembly comprising a metal extruded submount supporting a plurality of LEDs and a heat sink structure coextruded with the submount, the submount being extruded in a three-dimensional shape to create a desired light pattern in the enclosure;

a gas contained in the enclosure to provide thermal coupling to the LED assembly; and a glass stem fused to the enclosure and extending into the center of the enclosure, the glass stem supporting the LED assembly in the center of the enclosure such that the LED assembly is surrounded by the gas.

27. A lamp comprising:

an optically transmissive enclosure;

an LED assembly disposed in the optically transmissive enclosure to be operable to emit light when energized through an electrical connection, the LED assembly comprising a metal core board supporting and electrically coupled to a plurality of LEDs and a heat sink structure comprising a lead frame thermally coupled to the metal core board, the metal core board and lead frame being bent into a three-dimensional shape to create a desired light pattern in the enclosure.

* * * * *